(12) United States Patent
Yagi et al.

(10) Patent No.: US 6,868,105 B2
(45) Date of Patent: Mar. 15, 2005

(54) SEMICONDUCTOR LASER DEVICE, METHOD OF FABRICATING THE SAME, AND OPTICAL PICKUP EMPLOYING THE SAME

(75) Inventors: Ayumi Yagi, Yamatotakada (JP); Kazunori Matsubara, Shiki-Gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/351,488

(22) Filed: Jan. 27, 2003

(65) Prior Publication Data

US 2003/0147436 A1 Aug. 7, 2003

(30) Foreign Application Priority Data

Feb. 1, 2002 (JP) ........................................ 2002-025074
Oct. 10, 2002 (JP) ........................................ 2002-297199

(51) Int. Cl.[7] .............................. H01S 3/04; H01S 5/00
(52) U.S. Cl. .......................................... 372/36; 372/43
(58) Field of Search ......................... 372/34–36, 43–50

(56) References Cited

U.S. PATENT DOCUMENTS 5,703,893 A * 12/1997 Komiyama et al. ........... 372/43

FOREIGN PATENT DOCUMENTS

| JP | 06-203403 | 7/1994 |
| JP | 11-025465 | 1/1999 |
| JP | 2000-196176 | 7/2000 |
| JP | 2000-196177 | 7/2000 |
| JP | 2001-111159 | 4/2001 |

OTHER PUBLICATIONS

English language translation of JP 2000–196176.*

* cited by examiner

*Primary Examiner*—Quyen Leung
(74) *Attorney, Agent, or Firm*—Morrison & Foerster LLP

(57) ABSTRACT

A semiconductor laser device that is suitable for mass production, that permits an improved wire layout, and that permits miniaturization includes leads disposed through each of two side faces of an insulating frame member so as to run from outside to inside the insulating frame member, an LD and a light-receiving element mounted inside the insulating frame member, and wires laid inside the insulating frame member so as to connect the leads to the electrodes of the LD and the light-receiving element. Inside the insulating frame member, the tip of one lead is extended farther inward than the edge of an element mount portion that faces the tip of another lead that is disposed through the same side face of the insulating frame member.

14 Claims, 17 Drawing Sheets

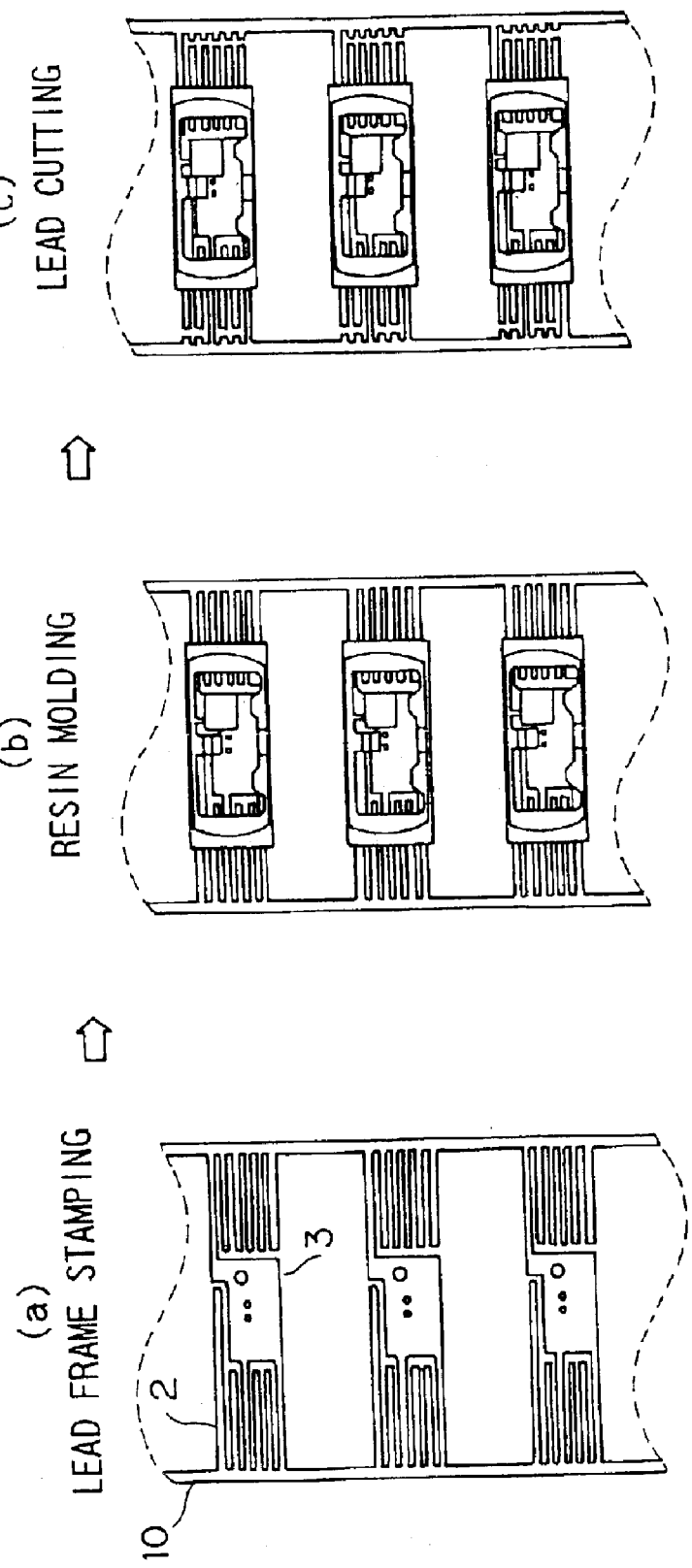

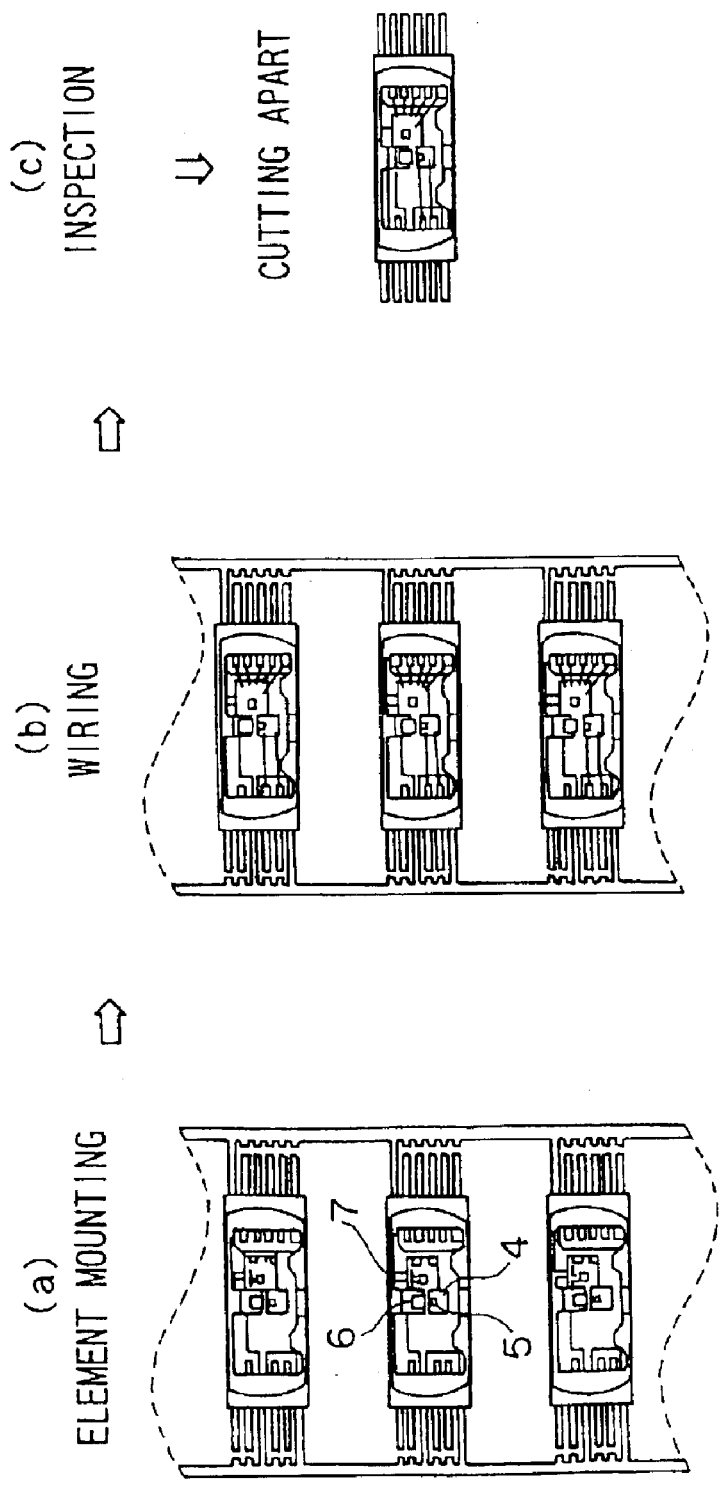

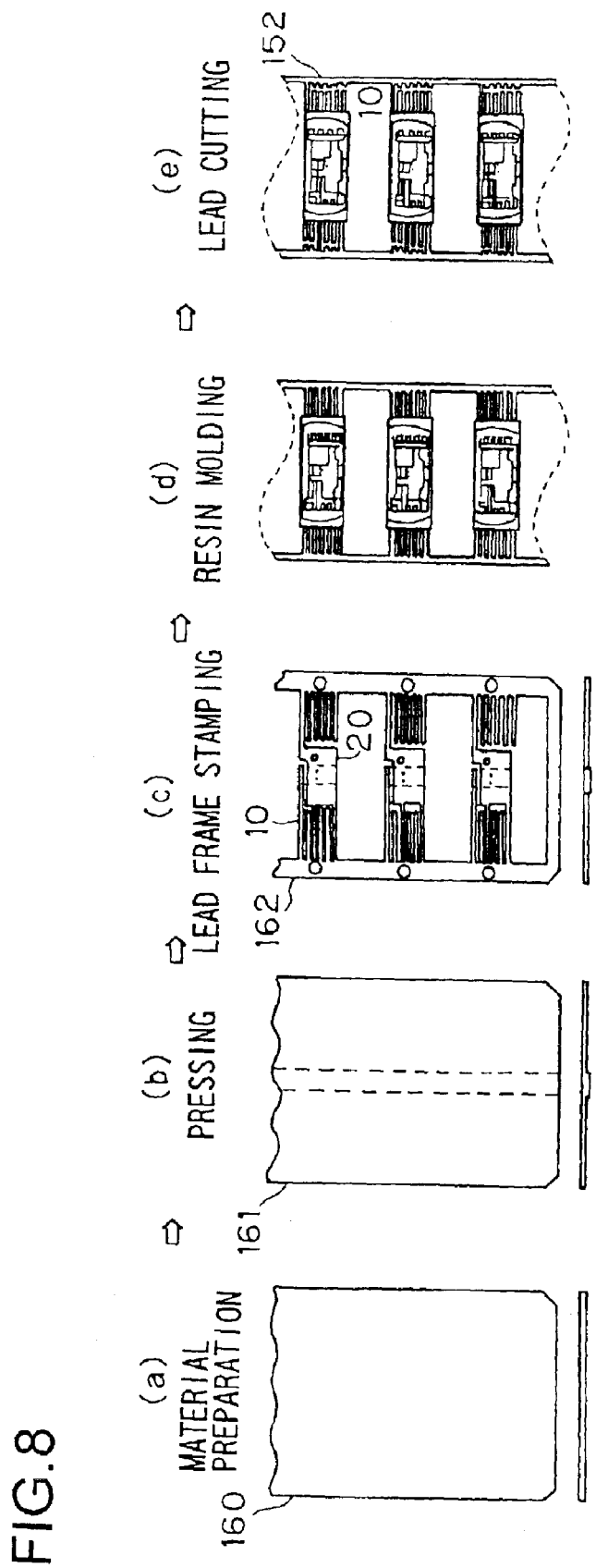

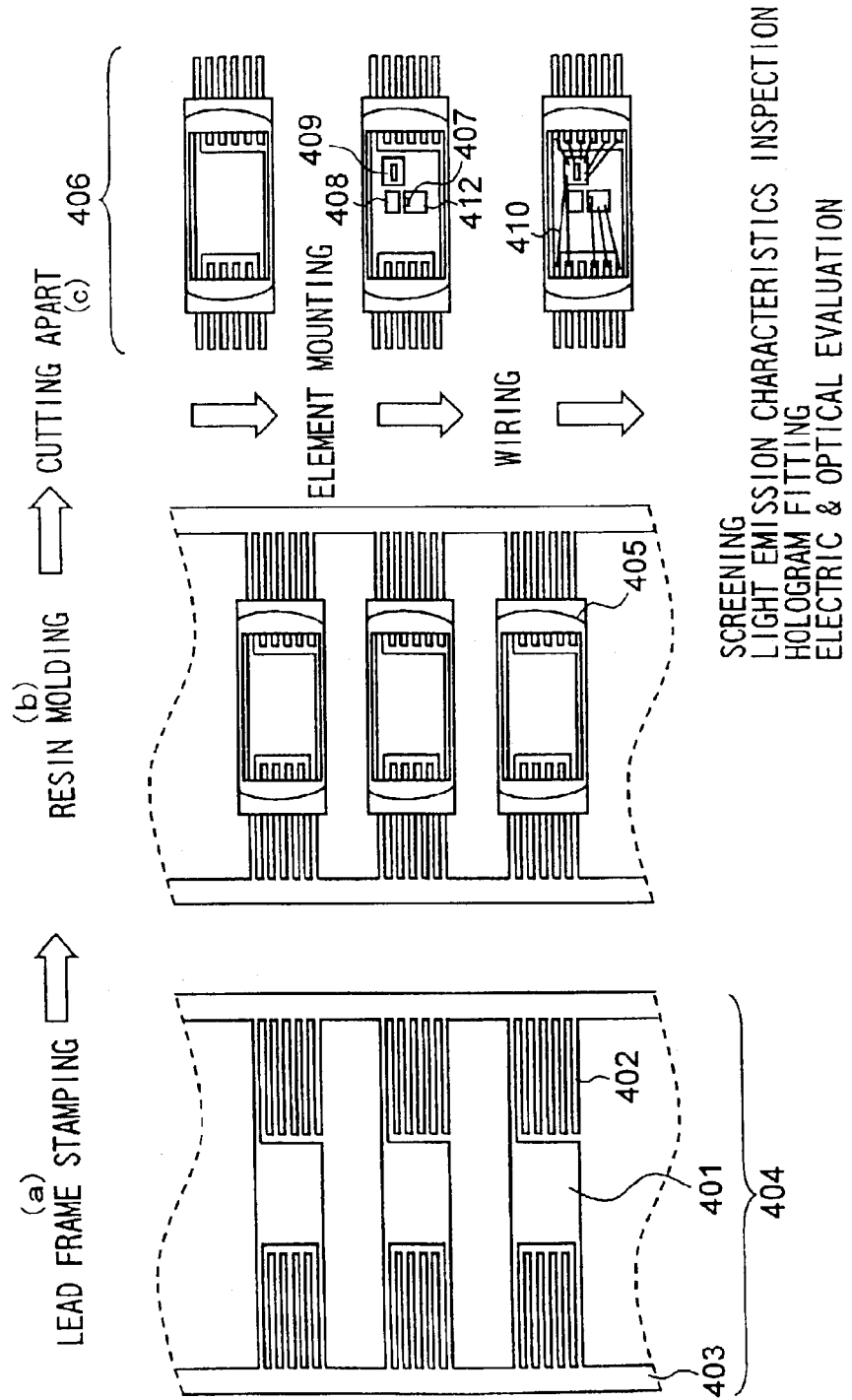

SEMICONDUCTOR LASER DEVICE, METHOD OF FABRICATING THE SAME, AND OPTICAL PICKUP EMPLOYING THE SAME

BACKGROUND OF THE INVENTION

1. Field of the Invention

The present invention relates to an optical pickup for reading information recorded on an optical recording medium, to a semiconductor laser device employed in such an optical pickup, and to a method of fabricating such a semiconductor laser device.

2. Description of the Prior Art

Optical pickup devices are used in optical memory devices, such as CD-ROM drives and MD drives, to read a signal from an optical disk, and some of them adopt semiconductor laser devices of a hologram laser type. A semiconductor laser device of a hologram laser type has a semiconductor laser element, a hologram element, and a signal-detecting light-receiving element built into a single package. The light emitted from the semiconductor laser element is reflected back from a disk used as an optical recording medium, and is then diffracted by the hologram element so as to be directed to the light-receiving element disposed away from the optical axis.

For example, Japanese Patent Application Laid-Open No. H6-5990 discloses a conventional semiconductor laser device of a hologram laser type, of which a perspective view is shown in FIG. 16. In the structure shown in FIG. 16, a semiconductor laser element (LD) and a signal-detecting light-receiving element or the like (not shown) are mounted on a stem 201, then a cap 202 is put on the stem 201 so as to cover the LD and the signal-detecting light-receiving element or the like, and then a hologram element 203 is fitted on the cap 202. supply of power to the elements disposed inside and the extraction of a signal therefrom are achieved by way of leads 208.

Moreover, in the package shown in FIG. 16, the stem 201 and the cap 202 are given the shapes of circles having upper and lower edges thereof cut off to slim down the package. In the package structured as shown in FIG. 16, it is necessary to form, in the stem 201, holes through which to put the leads 208, then put the leads 208 one by one through the holes, and then seal the holes with an insulating material. This requires a complicated fabrication method and high costs.

In recent years, to reduce the costs of optical pickup devices, attention has been paid to semiconductor laser devices fabricated with inexpensive packages made of resin and with leads formed in the form of a lead frame. For example, Japanese Patent Application Laid-Open No. H6-203403 discloses such a semiconductor laser device, of which the structure is shown in FIGS. 17A and 17B. FIG. 17A is a top view, and FIG. 17B is a side sectional view. In the structure shown in FIG. 17, a resin frame 302 having cylindrical portions 301 is used as a package, a plurality of leads 303 are disposed through each of two opposite sides of the resin frame 302 so as to run from outside to inside the package, and a hologram element 304 is fitted on the resin frame 302 so as to be located between the two cylindrical portions 301.

Now, a fabrication method applicable to the structure shown in FIG. 17 will be described with reference to FIG. 18, taking up as an example a semiconductor laser device having 12 leads in total, i.e. six leads through each of opposite sides thereof First, by stamping or etching, a strip-shaped sheet metal (hoop member) is formed into a lead frame 404 having island plates 401, on which to mount semiconductor elements, and leads 402. At this point, the island plates 401 and the leads 402 constituting one group and those constituting the adjacent groups are connected together by frame portions 403 in the form of continuous hoops (FIG. 18(a)).

Next, resin is molded on the lead frame 404 to form resin frames 405 that hold the leads 402 and the island plates 401 (FIG. 18(b)). After resin molding, individual packages 406 are cut apart (separated) from one another by cutting the lead frame 404 between the leads 402 and the frame portions 403.

With this structure, as opposed to the structure shown in FIG. 16 where it is necessary to put lead pins one by one through holes and then seal the holes with glass, it is possible to fabricate the semiconductor laser device through a series of processes suitable for mass production, specifically, stamping, molding, and cutting performed in this order. This helps greatly reduce costs.

Thereafter, as shown in FIG. 18(c), on the island plate 401 of each package 406, a submount 412 having an LD 407, a mirror 408, and a signal-detecting light-receiving element 409 mounted thereon is mounted, and then these are interconnected with Au wires 410 by wire bonding. Next, the LD. 407 is energized and left emitting light for several hours at a high temperature to screen out defective LDs, then its light emission characteristics are evaluated, and then a hologram element 411 is fitted. Here, the hologram element 411 serves also as the cap 202 in the package shown in FIG. 16. This helps reduce the number of components needed and thereby reduce costs. After the hologram element 411 is fitted, the semiconductor laser device is actually energized to inspect the signal obtained through light reception from a reference disk. This is to evaluate the electrical and optical characteristics of the semiconductor laser device and thereby pick out only acceptable ones. Now, the fabrication of the semiconductor laser device is complete.

In the example described above, the LD 407 emits light through a side end thereof, and therefore the mirror 408 is used to turn the optical axis by 90°. However, in a case where the LD 407 emits light through the top surface thereof, it is not necessary to use the mirror 408. In the example described above, the LD 407 is mounted directly on the island plate 401. However, a submount incorporating a monitoring photodiode for controlling the light output may be interposed therebetween.

In the semiconductor laser device described above with reference to FIGS. 17A, 17B, and 18, its optical axis is aligned substantially with the center of its external package. This is to ease the alignment of the optical axis when the semiconductor laser device is fitted to a pickup. Thus, the LD 407 and the mirror 408 are mounted at or near the center of the island plate of the package. On the other hand, the signal-detecting light-receiving element 409, which receives a signal beam separated from the optical axis by the hologram element 411, is disposed away from the optical axis. In the following description, the reference numerals used in FIG. 18 will be sticked to.

In this way, the LD 407 and the mirror 408 are located in the center of the island plate 401, and the signal-detecting light-receiving element 409 is located on one side of them. Here, the signal-detecting light-receiving element 409 incorporates a multisegment photodiode and, in some cases, even a preamplifier, and thus requires may signal terminals. Accordingly, many wires need to be connected to the light-receiving element, leading to a lopsided wire layout inside the package.

Moreover, as an increased number of wires are used, an accordingly increased number of leads need to be provided. Since more leads are required in that side of the package where the signal-detecting light-receiving element 409 is disposed, more leads are left unused in the opposite side.

If one dares to lay wires from one side of the package to leads in the opposite side, the wires run above the laser element (LD) 407 and the mirror 408, and thus intercept the beam.

How this looks is shown in FIGS. 19A and 19B, which show the conventional structure shown in FIG. 18 with wires additionally laid. FIG. 19A is a top view without the hologram element 411 fitted and FIG. 19B is a side view with the hologram element 411 fitted.

In the package shown in FIGS. 19A and 19B, there are provided 12 lead pins (402a to 402l) in total, i.e. six lead pins through each of two opposite sides thereof Of these lead pins provided, three 402a, 402f, and 402g are integral with the island plate 401. Thus, ten independent lead pins in total are provided. On the other hand, the number of lead pins required for wiring is as follows: the signal-detecting light-receiving element 409 requires eight, and the LD 407 and the submount 412 require three. Of these lead pins required, one used as ground (GND) by the signal-detecting light-receiving element 409 and one used as ground by the LD 407 can be made common. Thus, ten independent lead pins in total are required. Since the signal-detecting light-receiving element 409 requires more wires, two wires 410 need to be laid therefrom to the leads in the left, i.e., far, side, with the wires 410 running above the mirror 408.

This can be avoided by increasing the number of leads or securing a space, specifically by providing an extra lead or securing an extra space between the leads 402c and 402d and another between the leads 402i and 402j shown in FIG. 19. This permits the wires that otherwise need to be laid from the signal-detecting light-receiving element 409 to leads in the far side to be connected to leads in the near side, and thus helps prevent the wires from running above the mirror 408.

In a package of a lead frame type, increasing the number of leads results in increasing the thickness of the package and thus the thickness of the optical pickup that employs it. Moreover, increasing the size of the package results in increasing the costs of the metal and resin materials thereof and thus the overall costs thereof In particular, the hologram element 411 is expensive, and therefore it is desirable to make it as small as possible in order to minimize costs. However, in the structure shown in FIGS. 17A, 17B, and 18, since the hologram element 411 serves also as a cap, increasing the size of the package results in making its peripheral portions accordingly and unduly large. This leads to higher costs.

To slim down the package, wiring needs to be designed to leave as few leads as possible unused.

When the lead frame is still in the form of continuous hoops, to permit the island plates to be held connected to the frame portions, each island plate needs to be formed integral with at least one lead pin. However, when the lead frame in the form of continuous hoops is wound up or set on equipment, if the island plates are held by only one lead pin each, those leads may bend, causing the island plates to be displaced relative to the frame portions. For this reason, in practice, to hold the island plates and the frame portions stably, each island plate needs to be held at three points, specifically by three lead pints, i.e., one lead pin on either side plus another on one side. Thus, while one of these three lead pins is effectively used as being kept at the same potential as the island plate, the other two cannot be used independently for the wiring of semiconductor elements.

Before being cut out of the lead frame, the individual packages are arranged neatly. When cut apart, however, the packages need to be arranged in a tray for transfer, and bends in their leads need to be corrected.

On the other hand, when the lead frame is still in the form of continuous hoops, all leads are short-circuited. This makes it impossible to energize the LD and the signal-detecting light-receiving element for testing purposes.

In a case where the package is formed by molding resin, in particular thermoplastic resin, on the lead frame, application of heat thereto may soften the resin and thus cause deformation in the resin frame. Thus, wire bonding needs to be performed with supersonic waves alone without application of heat. This makes it difficult to obtain sufficient wire bonding strength, and increases faults in wire bonding.

In general, the reflecting member for deflecting the light emitted from the semiconductor laser element needs to be positioned with high accuracy. However, the accuracy with which it is actually mounted depends on the precision of die-bonding equipment. This makes it difficult to adjust the position of the reflecting member.

The light-receiving element is disposed on the same plane as the semiconductor laser element or the submount having the semiconductor laser element mounted thereon. This allows part of the light emitted from the semiconductor laser element to stray onto the light-receiving surface of the light-receiving element., and thereby degrades the S/N characteristic of the signal obtained through light reception.

The semiconductor laser element, as it emits light, generates heat. Since high temperature degrades the quality of the semiconductor laser element itself, it is necessary to efficiently reject heat to outside the package. In a package of a resin molding type, however, the back surface of the island plate, on which the semiconductor laser element is mounted, is covered by resin. This leads to poor heat rejection through the back surface of the package.

In addition to these problems, producing a pickup by using the conventional semiconductor laser device described above requires complicated position adjustment including the alignment of the optical axis.

SUMMARY OF THE INVENTION

An object of the present invention is to provide a semiconductor laser device, and a method of fabricating it, that is suitable for mass production, that permits an improved wire layout, and that permits miniaturization. Another object of the present invention is to provide an optical pickup that permits easy position adjustment including optical axis alignment, that requires less time for adjustment, and that thus can be produced with higher yield and higher productivity.

To achieve the above objects, according to the present invention, a semiconductor laser device including a plurality of leads disposed through each of two side faces of an insulating frame member so as to run from outside to inside the insulating frame member, at least a semiconductor laser element and a light-receiving element mounted inside or on the insulating frame member, and wires laid inside the insulating frame member so as to connect the leads to the electrodes of the semiconductor laser element and the light-receiving element is characterized in that, inside the insulating frame member, the tip of at least one of the leads is extended farther inward than the edge of an element mount portion that faces the tip of at least another of the leads that is disposed through the same side face of the insulating frame member as that one of the leads.

According to the present invention, as described above, the tip of at least one lead is extended farther inward than an edge of the element mount portion. This makes it easy to lay the wire connected to that lead differently than in the conventional example described earlier in order to arrange wires, for example, substantially uniformly. Accordingly, for example, by bending the tip of one or more of the leads disposed in the row located away from the signal-detecting light-receiving element, it is possible to increase the number of leads located near the signal-detecting light-receiving element, which requires many wires to be connected thereto, and thereby realize an efficient wire layout.

This eliminates the need to provide unnecessary leads or spaces, and thus helps miniaturize the device. Moreover, it is easy to avoid laying wires over the semiconductor laser element or, in a structure provided with a reflecting member for deflecting the light emitted from the semiconductor laser element, laying wires between the semiconductor laser element and the reflecting member or over the reflecting member.

According to the present invention, the semiconductor laser device described above is further characterized in that the lead with the extended tip is located closest to an edge among those leads which are disposed through the same side face of the insulating frame member as that lead.

According to the present invention, as described above, the lead with the extended tip is located closest to an edge among those leads which are disposed through the same side face of the insulating frame member as that lead. This makes it possible to realize a wire layout as described above with more reliability.

According to the present invention, an semiconductor laser device including a plurality of leads disposed through each of two side faces of an insulating frame member so as to run from outside to inside the insulating frame member, at least a semiconductor laser element and a light-receiving element mounted inside the insulating frame member, and wires laid inside the insulating frame member so as to connect the leads to the electrodes of the semiconductor laser element and the light-receiving element is characterized in that, inside the insulating frame member, at least one of the leads is bent toward an edge of that side face of the insulating frame member through which that one of the leads is disposed.

According to the present invention, as described above, at least one lead is bent toward an edge of that side face of the insulating frame member through which that lead is disposed. This makes it easy to lay the wire connected to that lead differently than in the conventional example described earlier in order to arrange wires, for example, substantially uniformly. Accordingly, for example, by bending one or more of the leads disposed in the row located away from the signal-detecting light-receiving element, it is possible to realize an efficient wire layout even with a signal-detecting light-receiving element that requires many wires to be connected thereto.

This eliminates the need to provide unnecessary leads or spaces, and thus helps miniaturize the device. Moreover, it is easy to avoid laying wires over the semiconductor laser element or, in a structure provided with a reflecting member for deflecting the light emitted from the semiconductor laser element, laying wires between the semiconductor laser element and the reflecting member or over the reflecting member.

According to the present invention, the semiconductor laser device described above is further characterized in that, inside the insulating frame member, the bent lead is extended farther inward than the lead located next thereto in the direction in which it is bent.

According to the present invention, as described above, the bent lead is extended farther inward than the lead located next thereto in the direction in which it is bent. This makes it possible to realize a wire layout as described above with more reliability.

According to the present invention, a semiconductor laser device including at least a semiconductor laser element and a light-receiving element mounted inside an insulating frame member, with the electrodes of the semiconductor laser element and the light-receiving element electrically connected to leads inside the insulating frame member, is characterized in that, inside the insulating frame member, a relay electrode is provided that is connected by way of a wire to at least one of the electrodes of the semiconductor laser element and the light-receiving element and that is connected by way of a wire to at least one of the leads.

According to the present invention, as described above, inside the insulating frame member, a relay electrode is provided that is connected by way of a wire to at least one of the electrodes of the semiconductor laser element and the light-receiving element and that is connected by way of a wire to at least one of the leads. This makes it easy to lay the wire connected to that lead differently than in the conventional example described earlier in order to arrange wires, for example, substantially uniformly. Accordingly, for example, by connecting one or more of the leads disposed in the row located away from the signal-detecting light-receiving element by way of wires via the relay electrode to the electrode of the light-emitting element, it is possible to realize an efficient wire layout even with a signal-detecting light-receiving element that requires many wires to be connected thereto.

This eliminates the need to provide unnecessary leads or spaces, and thus helps miniaturize the device. Moreover, it is easy to avoid laying wires over the semiconductor laser element or, in a structure provided with a reflecting member for deflecting the light emitted from the semiconductor laser element, laying wires between the semiconductor laser element and the reflecting member or over the reflecting member.

According to the present invention, the semiconductor laser device described above is further characterized in that the insulating frame member has an external surface parallel to the surface on which the semiconductor laser element is mounted or to the optical axis of the light emitted therefrom.

According to the present invention, the insulating frame member has an external surface parallel to the surface on which the semiconductor laser element is mounted or to the optical axis of the light emitted therefrom. By using the external surface as a reference surface, it is possible to perform optical axis alignment easily.

According to the present invention, the semiconductor laser device described above is further characterized in that, on the insulating frame member, a reflecting member mount portion is formed on which a reflecting member is mounted for deflecting the light emitted from the semiconductor laser element.

According to the present invention, on the insulating frame member, a reflecting member mount portion is formed on which a reflecting member is mounted for deflecting the light emitted from the semiconductor laser element. Thus, even if the semiconductor laser element is so arranged as to emit light in a direction parallel to the surface on which it is mounted, by disposing the reflecting member on the reflecting member mount portion of the insulating frame member, it is easy to deflect the emitted light.

According to the present invention, the semiconductor laser device described above is further characterized in that, on the insulating frame member, a light-receiving element mount portion is formed on which the light-receiving element is mounted parallel to the surface on which the semiconductor laser element is mounted.

According to the present invention, on the insulating frame member, a light-receiving element mount portion is formed on which the light-receiving element is mounted parallel to the surface on which the semiconductor laser element is mounted. Thus, it is easy to position the surface on which the semiconductor laser element is mounted parallel to the light-receiving surface.

According to the present invention, the semiconductor laser device described above is further characterized in that the light-receiving surface of the light-receiving element mounted on the light-receiving element mount portion is higher than the light-exit surface of the semiconductor laser element.

According to the present invention, the light-receiving surface of the light-receiving element mounted on the light-receiving element mount portion is higher than the light-exit surface of the semiconductor laser element. This prevents the light emitted from the semiconductor laser element from straying onto the light-receiving surface and hampering signal reception. Thus, it is possible to improve the S/N characteristic of the signal obtained through light reception.

According to the present invention, the semiconductor laser device described above is further characterized in that one of the leads has a semiconductor laser element mount portion on which the semiconductor laser element is mounted, and the whole or part of the semiconductor laser element mount portion has a thickness greater than a portion of that one of the leads located outside the insulating frame member.

According to the present invention, one lead has a semiconductor laser element mount portion on which the semiconductor laser element is mounted, and the whole or part of the semiconductor laser element mount portion has a thickness greater than a portion of that lead located outside the insulating frame member. This helps enhance heat rejection.

According to the present invention, the semiconductor laser device described above is further characterized in that the insulating frame member or a portion thereof formed so as to protrude upward has the shape of a cylinder of which two opposite sides are cut off along two planes parallel to each other and to the cylinder's axis, and the two planes are parallel to the direction of the longer sides of the insulating frame member and have different lengths in the direction of the longer sides of the insulating frame member.

According to the present invention, the insulating frame member or a portion thereof formed so as to protrude upward has the shape of a cylinder of which two opposite sides are cut off along two planes parallel to each other and to the cylinder's axis, and the two planes are parallel to the direction of the longer sides of the insulating frame member and have different lengths in the direction of the longer sides of the insulating frame member. This permits miniaturization of the device, permits arrangement of an asymmetric hologram element, permits miniaturization of the hologram element, and thus permits miniaturization of the device as a whole.

According to the present invention, the semiconductor laser device described above is further characterized in that a hologram element for diffracting the light emitted from the semiconductor laser element disposed inside and reflected back from a medium disposed outside so as to direct the light to the light-receiving element disposed inside is mounted on the top surface, parallel to the semiconductor laser element mount surface, of the insulating frame member or the portion thereof formed so as to protrude upward.

According to the present invention, a hologram element for diffracting the light emitted from the semiconductor laser element disposed inside and reflected back from a medium disposed outside so as to direct the light to the light-receiving element disposed inside is mounted on the top surface, parallel to the semiconductor laser element mount surface, of the insulating frame member or the portion thereof formed so as to protrude upward. This makes it easy to position the hologram element.

According to the present invention, the semiconductor laser device described above is further characterized in that part of the top surface of the insulating frame member or the portion thereof formed so as to protrude upward is so formed as to jut inward.

According to the present invention, part of the top surface of the insulating frame member or the portion thereof formed so as to protrude upward is so formed as to jut inward. This makes it easy to mount the hologram element, makes it possible to mount a smaller hologram element, and thus helps miniaturize the device.

According to the present invention, an optical pickup employing the semiconductor laser device described above is characterized in that the chassis of the optical pickup is disposed in contact with an external surface parallel to the surface on which the semiconductor laser element is mounted.

According to the present invention, the chassis of the optical pickup is disposed in contact with an external surface parallel to the surface on which the semiconductor laser element is mounted. This makes it easy to adjust the height of the chassis by using the external surface as a reference surface.

According to the present invention, an optical pickup employing the semiconductor laser device described above is characterized in that the cylindrical circumferential surfaces of the insulating frame member or the portion thereof formed so as to protrude upward fit in a hole formed in the chassis of the optical pickup.

According to the present invention, the cylindrical circumferential surfaces of the insulating frame member or the portion thereof formed so as to protrude upward fit in a hole formed in the chassis of the optical pickup. This makes it easy to adjust the position of the center of the optical axis of the chassis by using the circumferential surfaces as a reference surface.

According to the present invention, a method of fabricating a semiconductor laser device is characterized in that it goes through a step of forming insulating frame members by molding a resin material on a lead frame made of a conductive material and having a plurality of leads connected together by a frame portion so as to obtain a plurality of would-be device portions connected together; a step of fitting at least a semiconductor laser element and a light-receiving element to each of the would-be device portions to produce semiconductor laser devices still connected together; a step of inspecting the characteristics of the semiconductor laser devices by energizing them with leads connected to element mount portions electrically insulated from other leads; and a step of cutting the lead frame so as to separate the individual semiconductor laser devices.

According to the present invention, as described above, after the characteristics of the semiconductor laser devices are inspected by energizing them with the frame members connected together by the lead frame, the lead frame is cut so as to separate the individual semiconductor laser devices. Thus, it is easy to load/unload (set and remove) the devices, in a state before being separated into individual devices, on and from various types of fabrication equipment. Moreover, it is possible to avoid bending the leads as is inevitable in the conventional example described earlier. This helps enhance productivity.

According to the present invention, the method of fabricating a semiconductor laser device described above is further characterized in that the lead frame has some of the leads connected to element mount portions, the leads other than those are cut off from the frame portion before the inspection step, and the leads then left connected to the frame portion are cut off therefrom after the inspection step.

According to the present invention, as described above, in the lead frame, the leads other than those connected to element mount portions are cut off from the frame portion before the inspection step, and the leads then left connected to the frame portion are cut off therefrom after the inspection step. Thus, in the inspection step, even with the frame members connected together by the lead frame, it is easy to perform inspection of characteristics through energization by keeping those leads which are connected to the element mount portions and cut off from the frame portion at an identical potential such as the ground potential and keeping the other leads cut off from the frame portion at independent potentials.

According to the present invention, the method of fabricating a semiconductor laser device described above is further characterized in that the lead frame has, for each semiconductor laser device, a frame member support portion connected to the frame portion, the resin material is molded so as to include at least part of the frame member support portion, and the leads are cut off from the frame portion after the resin material is molded, so that the inspection step is performed with the insulating frame member supported by the frame member support portion.

According to the present invention, as described above, the inspection step is performed after the leads are cut off from the frame portion but with the frame member supported by the frame member support portion formed in the lead frame. Thus, in the inspection step, even with the frame members connected together by the lead frame, it is easy to perform inspection of characteristics through energization by keeping the individual leads at independent potentials. Moreover, it is possible to reduce the number of leads used to support the element support portion.

According to the present invention, the method of fabricating a semiconductor laser device described above is further characterized in that the frame member support portion has an end portion that is not connected to the frame portion, and the resin material is molded so as to include the end portion.

According to the present invention, as described above, the resin material is molded so as to include the end portion of the frame member support portion that is not connected to the frame portion. Thus, in the inspection step, simply by pulling off the end portion, the frame member support portion can easily be separated from the frame member.

According to the present invention, the method of fabricating a semiconductor laser device described above is further characterized in that the frame member support portion, at the side thereof that is not connected to the frame portion, is connected to the element mount portion and has a cut formed, so that, after the step of inspection, the frame member support portion is cut at the cut.

According to the present invention, as described above, the frame member support portion is connected to the element mount portion. This makes it possible to hold the element mount portion stably. Moreover, after the inspection step, the frame member support portion is cut at the cut formed in it. This makes it easy to separate the frame member support portion from the frame member.

According to the present invention, a method of fabricating a semiconductor laser device is characterized in that it goes through a step of forming an insulating frame member by molding a resin material on a lead frame made of a conductive material and having a plurality of leads connected together by a frame portion; a step of fitting at least a semiconductor laser element and a light-receiving element inside the insulating frame member; and a step of laying wires so as to connect the electrodes of the semiconductor laser element and the light-receiving element t leads. Here, on the face of the insulating frame member on which no wires are laid, openings are formed so as to expose parts of the leads, so that wires are connected by heating the exposed parts of the leads with a heater kept in contact therewith through the opening.

According to the present invention, as described above, wires are connected by application of heat thereto with a heater kept in contact with the parts of the leads exposed through openings formed in the insulating frame member on that side thereof on which wires are not laid. This makes it possible to heat the leads without excessively heating the resin of the frame member and thereby achieve satisfactory wire connection.

BRIEF DESCRIPTION OF THE DRAWINGS

This and other objects and features of the present invention will become clear from the following description, taken in conjunction with the preferred embodiments with reference to the accompanying drawings in which:

FIG. 2 is a diagram illustrating the processes of fabricating the semiconductor laser device of Embodiment 1, using schematic top views thereof;

FIG. 3 is a diagram illustrating the processes of fabricating the semiconductor laser device of Embodiment 1, using schematic top views thereof;

FIG. 8 is a diagram showing the processes of fabricating the package of a ninth embodiment (Embodiment 9) of the invention, using plan views at (a) to (e) with side views added below at (a) to (c);

FIG. 18 is a diagram showing the fabrication processes applicable to the semiconductor laser device of FIGS. 17A and 17B, using top views thereof.

DESCRIPTION OF THE PREFERRED EMBODIMENTS

Hereinafter, embodiments of the present invention will be described with reference to the drawings.

Embodiment 1

Figure 1A:
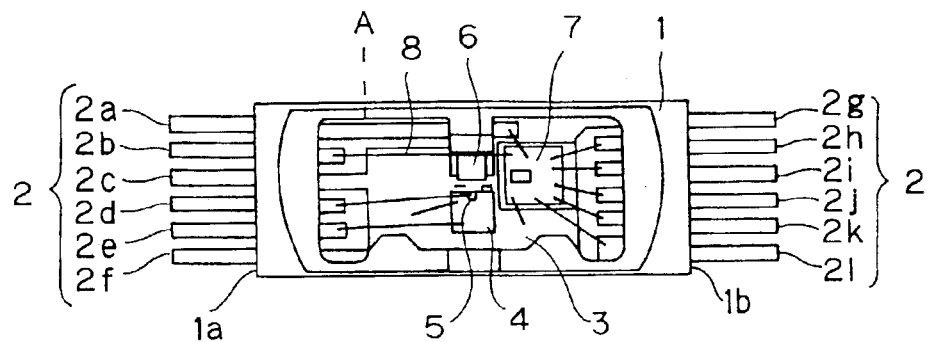
FIGS. 1A to 1E are diagrams showing an outline of the structure of the semiconductor laser device of a first embodiment (Embodiment 1) of the invention, FIG. 1A being a top view without the hologram element fitted, FIGS. 1B and 1C being side views with the hologram element fitted, and FIGS. 1D and 1E being schematic side sectional views with the hologram element fitted.
Figure 1C:
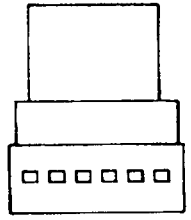
Figure 1B:
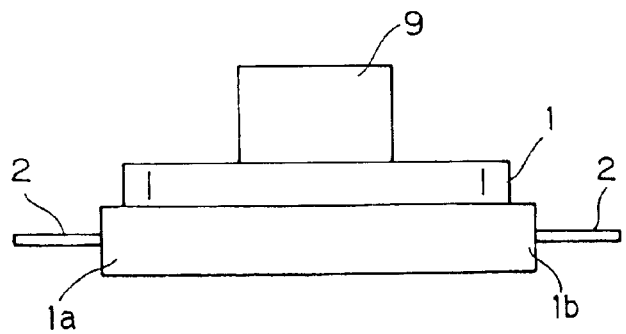
Figure 1E:
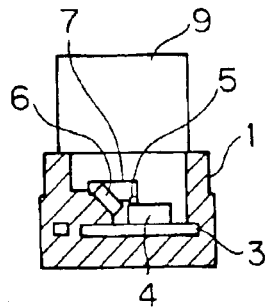
Figure 1D:
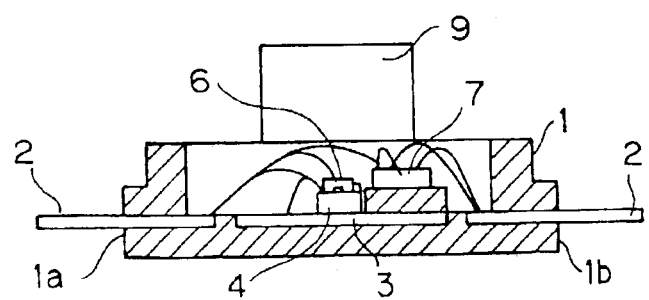

FIGS. 1A to 1E are diagrams showing an outline of the structure of the semiconductor laser device of a first embodiment (Embodiment 1) of the invention. FIG. 1A is a top view without the hologram element fitted, FIGS. 1B and 1C are side views with the hologram element fitted, and FIGS. 1D and 1E are schematic side sectional views with the hologram element fitted.

As shown in FIGS. 1A to 1E, the semiconductor laser device of this embodiment includes a plurality of leads 2 (2a to 2l) disposed through each of two sides 1a and 1b of an insulating frame member 1 so as to run from outside to inside it, a semiconductor laser element (LD) 5 and a signal-detecting light-receiving element 7 mounted inside the insulating frame member 1, and wires 8 laid inside the insulating frame member 1 so as to connect the leads 2a to 2l to the electrodes of the semiconductor laser element 5 and the light-receiving element 7. Inside the frame member, the tip of the lead 2a is extended farther inward than the position A of the edge of the element mount portion (island plate) 3 that faces the tips of the other leads 2b, 2d, and 2e disposed through the same side face 1a of the insulating frame member 1 as the lead 2a. Moreover, in this embodiment, the lead 2a with the extended tip is located closest to an edge among the leads 2a to 2f disposed through the same side face 1a of the insulating frame member 1 as the lead 2a.

The frame member 1 holds the island plate 3 and the leads 2, and thereby forms an outer structure. On the island plate 3, an LD 5 of a side light emission type is mounted with a submount 4 interposed in between. In front of the beam exit surface of the LD 5, a reflecting member (mirror) 6 is mounted, so that the light emitted from the LD 5 is deflected by the mirror 6. On the right-hand side, as seen in the figure, of the LD 5 and the mirror 6, a signal-detecting light-receiving element 7 is mounted. The electrodes of the elements 5 and 7 are connected by way of Au wires 8 to the leads 2, and, above all these is fitted a hologram element 9.

Figure 19A:
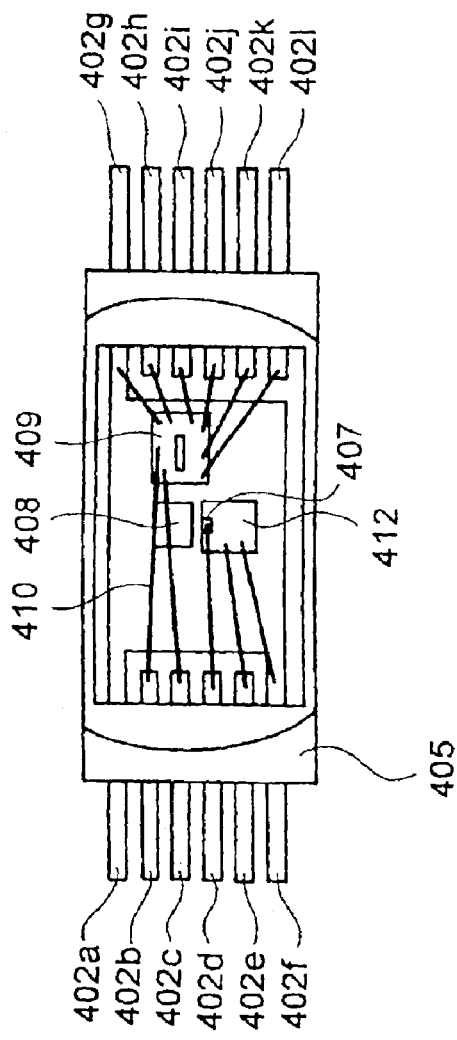
FIGS. 19A and 19B are diagrams showing an outline of the structure of the semiconductor laser device fabricated by the fabrication processes of FIG. 18, FIG. 19A being a top view and FIG. 19B being a side sectional view.
Figure 19B:
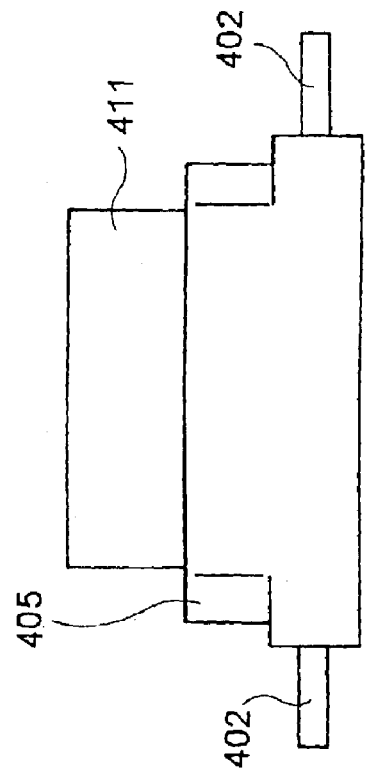

In the conventional example shown in FIG. 19 described earlier, the lead 402a is connected to the island plate 401 so as to be integral therewith. By contrast, in this embodiment, the lead 2a is separated from the island plate 3, and its tip is, inside the frame member 1, extended toward the leads 2g to 2l in the opposite side. Instead, the lead 2c is connected to the island plate 3 so as to be integral therewith.

By extending the tip of the lead 2a toward the side opposite to the position A of the edge of the island plate 3 in this way, it is possible to increase, from six to seven, the number of leads located near the signal-detecting light-receiving element 7, which requires many wires to be connected thereto. This makes it easy to lay wires. In addition, the island plate 3 is held by three leads 2c, 2f, and 2g, and therefore it is possible to maintain the same holding strength as in the conventional example.

As described above, in the semiconductor laser device of this embodiment, the tip of the lead 2a is extended farther inward than the position A of the edge of the element mount portion 3. This makes it easy to lay the wire 8 connected to that lead 2a differently than in the conventional example described earlier in order to arrange wires 8, for example, substantially uniformly. Accordingly, by extending toward the signal-detecting light-receiving element 7 the tip of one or more of the leads 2a to 2f disposed in the row located away from the signal-detecting light-receiving element 7, it is possible to increase the number of leads located near the signal-detecting light-receiving element 7, which requires many wires to be connected thereto, and thereby realize an efficient wire layout. This eliminates the need to provide unnecessary leads or spaces, and thus helps miniaturize the device. Moreover, it is easy to avoid laying wires 8 over the semiconductor laser element 5 or, in a structure provided with a reflecting member 6 for deflecting the light emitted from the semiconductor laser element 5, laying wires between the semiconductor laser element 5 and the reflecting member 6 or over the reflecting member 6.

Next, the method of fabricating the semiconductor laser device of this embodiment will be described with reference to FIGS. 2 and 3, which show its fabrication processes using schematic top views thereof.

Conductive sheet metal is, for example by stamping, formed into a lead frame that has a plurality of leads 2 connected to frame portions 10 on both sides and that has element mount portions (island plates) 3 between the frame portions 10 (FIG. 2(*a*)). Next, a resin material is molded (resin molding) on the lead frame to form insulating frame members 1 to obtain a plurality of would-be device portions connected together (FIG. 2(*b*)). Then, to electrically insulate the leads connected to the island plates 3 from the other leads, the leads that are not connected to the island plate 3 are cut off from the frame portions 10 (FIG. 2(*c*)).

Thereafter, on each island plate 3, a submount 4 having a semiconductor laser device (LD) mounted thereon, a reflecting member (mirror) 6, and a signal-detecting light-receiving element 7 are mounted (FIG. 3(*a*)). Then, Au wires 8 are laid by wire bonding (FIG. 3(*b*)). Next, as in the conventional example described earlier, screening is performed, light emission characteristics are inspected, a hologram element is fixed, electrical and optical characteristics are inspected, and then, lastly, individual devices are cut off and separated from the frame portions 10. Now, the fabrication of the semiconductor laser device is complete (FIG. 3(*c*)). Here, inspection of optical characteristics is performed by energizing the leads 2.

In the conventional fabrication method described earlier with reference to FIG. 18, after resin molding, first individual devices are cut apart and then mounting of elements, inspection of characteristics, and other processes are performed. This makes handling of the packages difficult. By contrast, according to the fabrication method of this embedment, the leads that support the island plates are not cut, so that, with the packages connected to the lead frame, the lead frame can loaded/unloaded (set and removed) on and from various kinds of fabrication equipment. On the other hand, all the leads that are used for independent signals are cut off, so that, with the packages connected to the lead frame, inspection requiring energization can be performed. That is, with the packages still on the lead frame, mounting of elements, wire bonding, inspection, and other processes can be performed. This enhances mass productivity. The fabrication method of this embodiment is applicable also to the conventional structures shown in FIGS. 17A, 17B, 19A, and 19B described earlier.

In this way, according to the fabrication method of this embodiment, as described above, after inspection of characteristics through energization is performed with the frame members 7 connected together by the lead frame, the lead frame is cut so as to separate individual devices. Thus, it is easy to load/unload (set and remove) the devices, in a state before being separated into individual devices, on and from various types of fabrication equipment. Moreover, it is possible to avoid bending the leads as is inevitable in the conventional example described earlier. This helps enhance productivity.

Embodiment 2

Figure 4:
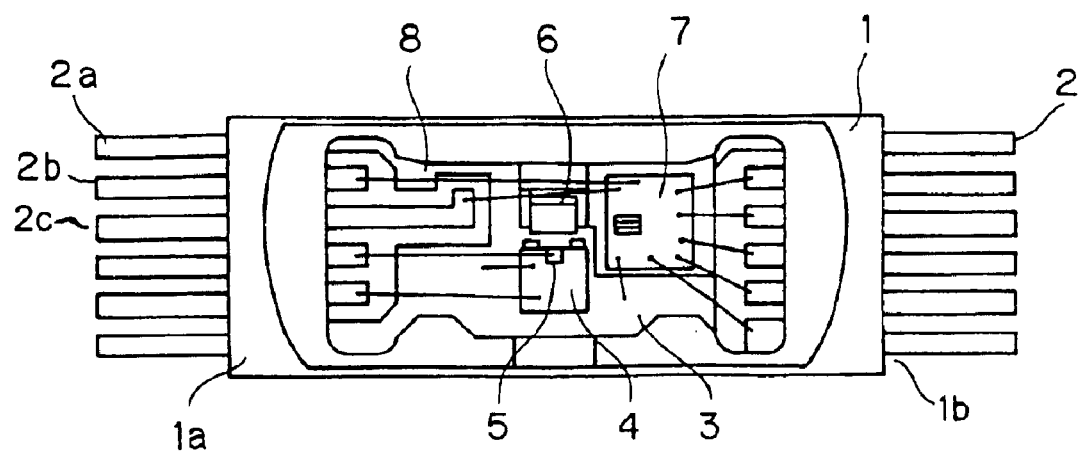
FIG. 4 is a top view showing an outline of the structure of the semiconductor laser device of a second embodiment (Embodiment 2) of the invention, without the hologram element fitted.

FIG. 4 is a top view showing an outline of the structure of the semiconductor laser device of a second embodiment (Embodiment 2) of the invention, without the hologram element fitted.

This embodiment differs from Embodiment 1 described above only in the leads 2a and 2c. In other respects, this embodiment is the same as Embodiment 1 described above, and therefore only the differences will be described below. In the following description, the same reference numerals as in FIGS. 1A to 1E are used irrespective of whether they appear in FIG. 4 or not.

The semiconductor laser device of this embodiment includes a plurality of leads 2 disposed through each of two sides 1a and 1b of an insulating frame member 1 so as to run from outside to inside it, a semiconductor laser element (LD) 5 and a signal-detecting light-receiving element 7 mounted inside the insulating frame member 1, and wires laid inside the insulating frame member 1 so as to connect the leads 2 to the electrodes of the LD 5 and the light-receiving element 7. Inside the frame member 1, the lead 2c is bent toward an edge of the side face 1a of the insulating frame member 1 through which the lead 2c is disposed. Moreover, the bent lead 2c is extended farther inward than the lead 2b located in the direction in which it is bent.

That is, in this embodiment, instead of extending the tip of the lead 2a toward the opposite side as in Embodiment 1 described above, the lead 2c is bent toward the lead 2a.

In the semiconductor laser device of this embodiment, as described above, the lead 2c is bent toward an edge of the side face 1a of the insulating frame member 1 through which the lead 2c is disposed. This makes it easy to lay the wire connected to that lead 2a differently than in the conventional example described earlier in order to arrange wires, for example, substantially uniformly. Accordingly, for example, by bending one or more of the leads disposed in the row located away from the signal-detecting light-receiving element, it is possible to realize an efficient wire layout even with a signal-detecting light-receiving element that requires many wires to be connected thereto.

This eliminates the need to provide unnecessary leads or spaces, and thus helps miniaturize the device. Moreover, it is easy to avoid laying wires over the semiconductor laser element or, in a structure provided with a reflecting member for deflecting the light emitted from the semiconductor laser element, laying wires between the semiconductor laser element and the reflecting member or over the reflecting member.

Embodiment 3

Figure 5:
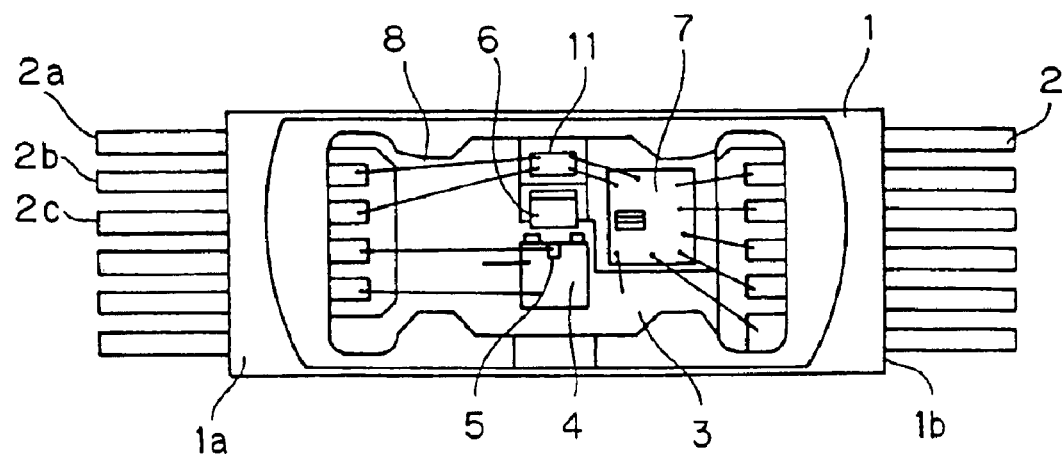
FIG. 5 is a top view showing an outline of the structure of the semiconductor laser device of a third embodiment (Embodiment 3) of the invention, without the hologram element fitted.

FIG. 5 is a top view showing an outline of the structure of the semiconductor laser device of a third embodiment (Embodiment 3) of the invention, without the hologram element fitted.

This embodiment differs from Embodiment 1 described earlier only in the leads 2a and 2c and the relay electrode 11. In other respects, this embodiment is the same as Embodiment 1 described earlier, and therefore only the differences will be described below. In the following description, the same reference numerals as in FIGS. 1A to 1E are used irrespective of whether they appear in FIG. 5 or not.

The semiconductor laser device of this embodiment includes a semiconductor laser element (LD) 5 and a signal-detecting light-receiving element 7 mounted inside an insulating frame member 1, and, inside the insulating frame member 1, the electrodes of the LD 5 and the signal-detecting light-receiving element 7 are electrically connected to leads 2. Moreover, inside the insulating frame member 1, a relay electrode 11 is provided that is connected by way of wires to the electrodes of the signal-detecting light-receiving element 7 and that is connected by way of wires to the leads 2b and 2c.

That is, in this embodiment, an electrode 11 for relaying wires is provided on the side of the reflecting member (mirror) 6 opposite to the LD 5, as seen in the figure. Of the Au wires 8, those connected from the signal-detecting light-receiving element 7 to the leads 2b and 2c in the opposite side are relayed via the relay electrode 11. The relay electrode 11 can be formed by laying a conductive material on the element mount portion (island plate) 3 with an insulating material interposed in between.

In the semiconductor laser device of this embodiment, as described above, inside the insulating frame member 1, a relay electrode 11 is provided. This makes it easy to lay the wires connected to the leads 2b and 2c differently than in the conventional example described earlier in order to arrange wires, for example, substantially uniformly. Accordingly, for example, by connecting one or more of the leads disposed in the row located away from the signal-detecting light-receiving element 7 by way of wires via the relay electrode 11 to the electrode of the light-emitting element 7, it is possible to realize an efficient wire layout even with a signal-detecting light-receiving element 7 that requires many wires to be connected thereto.

This eliminates the need to provide unnecessary leads or spaces, and thus helps miniaturize the device. Moreover, it is easy to avoid laying wires over the semiconductor laser element or, in a structure provided with a reflecting member for deflecting the light emitted from the semiconductor laser element, laying wires between the semiconductor laser element and the reflecting member or over the reflecting member.

The semiconductor laser devices of Embodiments 2 and 3 can be fabricated by the fabrication method described earlier in connection with Embodiment 1.

Embodiment 4.

Figure 6:
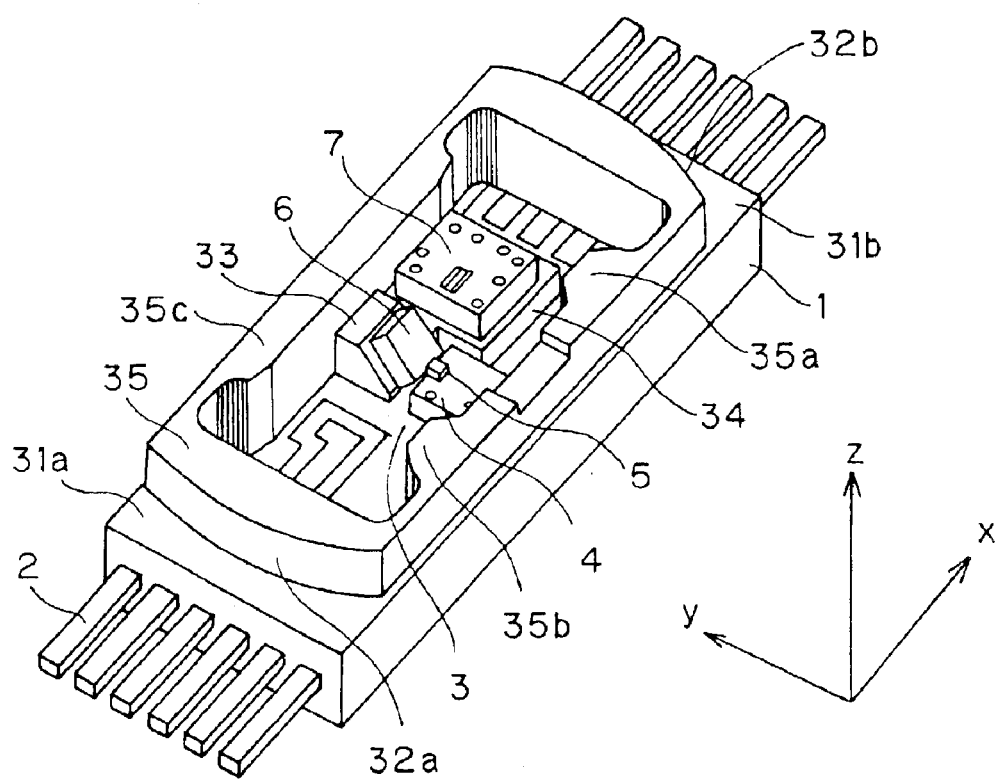
FIG. 6 is a perspective view showing an outline of the structure of the semiconductor laser devices of a fourth to an eighth embodiment (Embodiments 4 to 8) of the invention.

FIG. 6 is a perspective view of the semiconductor laser device FIG. 4, and illustrates an outline of the structure of the semiconductor laser devices of a fourth embodiment (Embodiment 4) of the invention. As in FIG. 4, to make the internal structure easier to see, the semiconductor laser device is shown without the hologram element fitted on top thereof In the following description, the x-, y-, and z-axes shown in the figure are used to identify directions.

In FIG. 6, the insulating frame member 1 has an external surface 31 (31a and 31b) that is parallel to the LD mount portion 3 that has a surface on which the LD 5 is mounted. In this embodiment, the LD 5 is mounted on the LD mount portion 3 with the submount 4 interposed in between. Since the top and bottom surfaces of the submount 4 are parallel, the external surface 31 is parallel to the LD 5. The external surface 31, which is used as a reference surface, is so designed as to be located at a predetermined distance from the light emission point of the LD 5 in the z-axis direction.

The reference surface 31 is formed integrally with the LD mount portion 3 by the mold with which the frame member is molded, and therefore, by producing the mold with high precision, it is possible to obtain a reference surface parallel to the LD mount portion 3 with high accuracy. This makes it easy to fit the device to an optical pickup.

Embodiment 5

Further with reference to FIG. 6, the semiconductor laser device of a fifth embodiment (Embodiment 5) of the invention will be described. In FIG. 6, the insulating frame member 1 has a reflecting member mount portion 33 formed integrally therewith by resin molding. The reflecting member mount portion 33 has a reflecting member mount surface on which is disposed the reflecting member 6 for deflecting the light emitted from the semiconductor laser element 5. The reflecting member mount surface of the reflecting member mount portion 33 forms an angle of 45° relative to the LD mount surface of the LD mount portion 3. Moreover, in this embodiment, a flat reflective mirror 6 is mounted on the reflecting ember mount portion 33. Instead, it is also possible to form a reflective film directly on the reflecting member mount surface by vapor deposition or the like.

Since the reflecting member mount portion 33 is formed integrally with the LD mount portion 3 by the use of the mold by which the frame member is molded, by producing the mold with high precision, it is possible to obtain with high accuracy a reflecting member mount surface that is inclined at 45° relative to the LD mount portion 3. This makes it easy to produce a semiconductor laser device with satisfactory radiation characteristics, i.e., with less deviation of the optical axis.

Embodiment 6

Further with reference to FIG. 6, the semiconductor laser device of a sixth embodiment (Embodiment 6) of the invention will be described. In FIG. 6, the insulating frame member 1 has a light-receiving element mount portion 34 formed integrally therewith by resin molding. The light-receiving element mount portion 34 has a light-receiving element mount surface on which the signal-detecting light-receiving element 7 is disposed.

Moreover, the light-receiving surface of the light-receiving element 7 on the light-receiving element mount portion 34 is higher than the light emission point of the LD 5.

Since the light-receiving element mount portion 34 is formed integrally with the LD mount portion 3 by the use of the mold by which the frame member is molded, by producing the mold with high precision, it is possible to obtain with high accuracy a light-receiving element mount portion 34 parallel to the LD mount portion 3. This makes it possible to dispose the light-receiving element 7 parallel to the LD5 so that the spot of the signal light strikes a predetermined position on the light-receiving element 7. As a result, it is possible to obtain light reception characteristics as designed.

Moreover, since the light-receiving surface of the light-receiving element 7 is higher than the light emission point of the LD 5, the light from the LD 5 does not directly enter the light-receiving element. This improves the S/N characteristic of the signal.

Embodiment 7

Next, with reference to FIGS. 6 and 7A to 7D, the semiconductor laser device of a seventh embodiment (Embodiment 7) of the invention and an optical pickup employing it will be described.

In FIG. 6, the insulating frame member 1 has a portion (protrusion) 35 that continuously surrounds the LD mount surface and that protrudes upward. The circumference of the protrusion 35 has the shape of a circle having segments thereof cut off at opposite sides, i.e., a shape surrounded by two opposite arcs and two opposite chords. At the two opposite arcs of this shape are arranged the faces through which leads are disposed and the external surface 31.

The protrusion 35 is formed integrally with the insulating frame member 1 by resin molding, and is so formed that the center of the arc-shaped side surfaces thereof coincides with the optical axis of the LD5 after being bent by the reflecting member 6. By producing the mold with high precision, it is possible to make the center of the arc-shaped side surfaces of the protrusion 35 coincide with the optical axis with high accuracy.

Figure 7A:
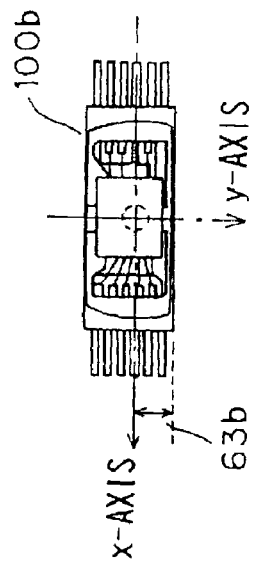
FIGS. 7A to 7D are diagrams illustrating the semiconductor laser device of Embodiment 7 and an optical pickup employing it, FIG. 7A being a diagram showing an outline of the structure of the optical pickup, FIG. 7B being a perspective view thereof, FIG. 7C being a diagram showing the slim-type semiconductor laser device fitted to the optical pickup, and FIG. 7D being a diagram showing a thicker semiconductor laser device.

Now, how the semiconductor laser device is built into a pickup will be described. FIGS. 7A and 7B are diagrams illustrating how the semiconductor laser device 100 of the invention is fitted to a housing 50 to produce an optical pickup. FIG. 7A, by showing the inside of the housing 50, illustrates the structure of the pickup. The light emitted from the semiconductor laser device 100 travels by way of a collimating lens 101, a turning mirror 102, and an objective lens 103, and is condensed to converge on an optical disk 104.

As shown in FIG. 7B, the semiconductor laser device 100 is fitted to the housing 50 with the above-described protrusion 35 inserted into a fitting hole 52 formed in the fitting surface 51 of the housing 50. Here, the reference surface, i.e., the external surface 31, of the semiconductor laser device 100 makes contact with the fitting surface 51 of the housing 50, and the arc-shaped side surfaces of the protrusion 35 of the semiconductor laser device 100 make contact with the fitting hole 52. This makes it possible to dispose the semiconductor laser device 100 in such a way that the optical axis thereof coincides with the optical axis 53 of the housing, and that the semiconductor laser device 100 is located at a prescribed distance from the collimating lens 101.

Figure 7C:
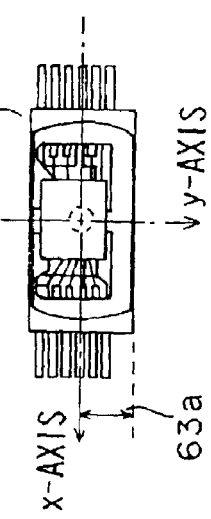
Figure 7B:
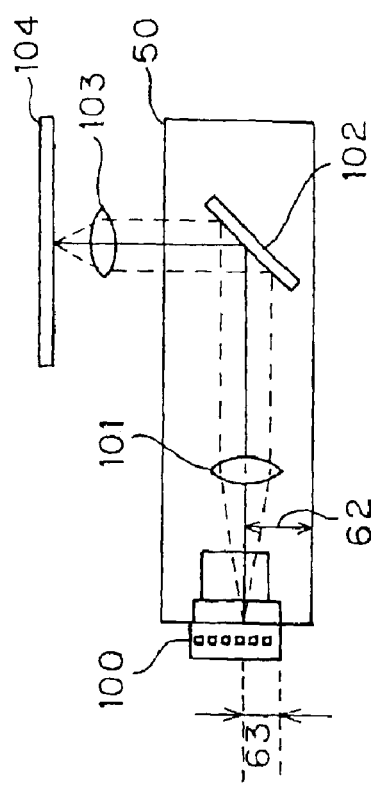
Figure 7D:
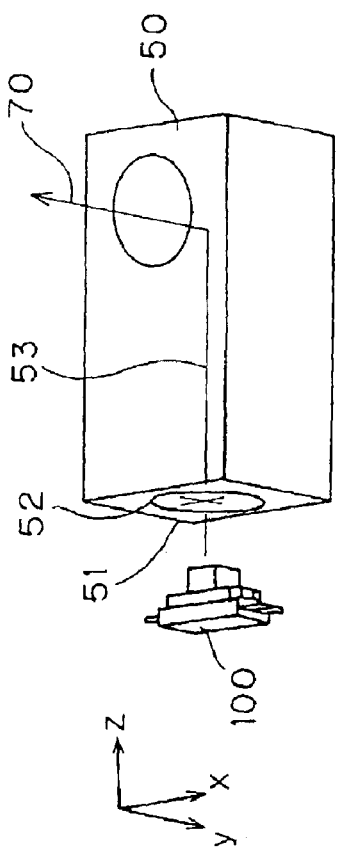

Moreover, as shown in FIG. 7C, the shape of the arc-shaped portions of the protrusion 35 is asymmetric with respect to the x-axis, so that the distance from the x-axis to one edge of the insulating frame member 1 differs from the distance to the other edge. FIG. 7D shows a case where the shape of the arc-shaped portions are symmetric with respect to the x-axis. To produce a slim optical pickup, it is necessary to reduce the distance 62 from the optical axis of the optical pickup to the bottom thereof. To achieve this, also in the semiconductor laser device 100 fitted to the housing, it is necessary to reduce the distance 63 from its optical axis to its edge in the y-axis direction. This distance 63b in the semiconductor laser device 100b shown in FIG. 7C is shorter than the corresponding distance 63a in the semiconductor laser device 100a shown in FIG. 7D. In this way, giving the arc-shaped portions of the protrusion 35 an asymmetric shape, it is possible to produce a slimmer optical pickup.

Embodiment 8

Next, with reference to FIG. 6, the semiconductor laser device of an eighth embodiment (Embodiment 8) of the invention will be described. In FIG. 6, the protrusion 35 of the insulating frame member 1 is formed integrally with the insulating frame member 1 by resin molding. By producing the mold with high precision, it is possible to make the top surface of the protrusion 35 parallel to the LD mount portion 3 with high accuracy. By mounting a hologram element on the top surface of the protrusion 35 by the use of adhesive, it is possible to dispose the hologram element parallel to the LD 5 with high accuracy. This permits the spot of the signal light from the hologram element to strike a predetermined position on the light-receiving element 7, and thus makes it possible to obtain light reception characteristics as designed.

Moreover, portions 35a, 35b, and 35c of the protrusion 35 are so formed as to jut inward, and the optical element such as a hologram element is placed on those portions. This increases the area of bonding over which the hologram element is fitted to the protrusion 35 with adhesive, and thus makes it possible to fit the hologram element to the insulating frame member 1 with satisfactory positional stability and bonding strength. Moreover, it is possible to fit a smaller hologram element, and the use of a smaller hologram element leads to a reduction in material costs.

Embodiment 9

Next, with reference to FIG. 8, the semiconductor laser device of a ninth embodiment (Embodiment 9) of the invention will be described. A package for a semiconductor laser needs to be designed to efficiently conduct the heat generated as the semiconductor laser element emits light. To achieve this, it is advisable that the lead frame be made of a copper-based material with high thermal conductivity, and that the lead frame be made thicker near the semiconductor laser device.

The aim may be achieved also by making the entire lead frame thicker. However, the lead pitch (the distance from one lead to the next) depends on the thickness of the lead frame, and therefore making the entire lead frame thicker results in a larger package. For this reason, making the lead portion of the lead frame thin and making only the most important portion thereof, i.e. the portion around the semiconductor laser device, thicker is the efficient way to miniaturize and slim down the package.

First, as shown in FIG. 8(a), as a lead frame material 160, sheet metal is prepared of which the thickness is 1.5 times as great as the thickness of the leads when the package is finished. Then, as shown in FIG. 8(b), the sheet metal is pressed so that the portion of the lead frame other than where the semiconductor laser device is mounted (the island plate portion 30) has a predetermined thickness. As a result of pressing, the thickness of the portion where the semiconductor laser device is mounted is increased, and in this way an irregularly shaped hoop material 161 is produced.

Next, as shown in FIG. 8(c), by stamping or etching, the irregularly shaped hoop material 161 is formed into a lead frame 162 having island plates 30 and leads 2.

Next, as shown in FIGS. 8(d) and 8(e), resin is molded, and the leads 10 are cut off from the frames 152. In this way, a package with a greater lead frame thickness around the semiconductor laser element mount portion is produced.

It is to be noted that the fabrication method of the high-heat-rejection semiconductor laser device (FIG. 8) differs from those of the ordinary-heat-rejection semiconductor laser devices (FIGS. 2 and 3) only in that the former additionally includes the process of pressing the lead frame material, and the following processes starting with resin molding can be made common. This permits the sharing of the same fabrication equipment between the two types of fabrication method, and thus helps reduce fabrication costs.

Embodiment 10

Figure 9:
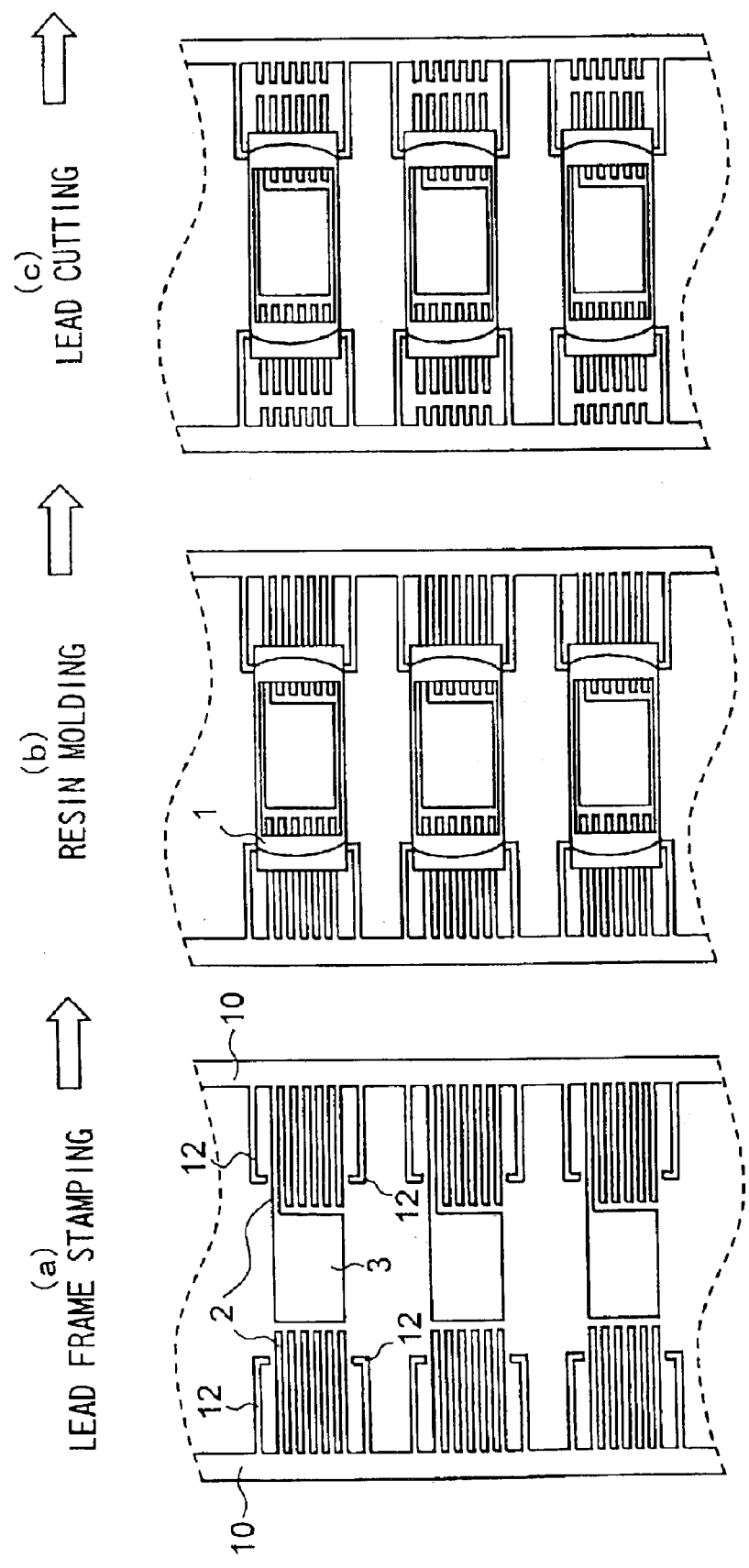
FIG. 9 is a diagram illustrating the processes of fabricating the semiconductor laser device of a tenth embodiment (Embodiment 10) of the invention, using schematic top views thereof.

Next, as a tenth embodiment (Embodiment 10) of the invention, a method of fabricating a semiconductor laser device different from that of Embodiment 1 described earlier will be described with reference to FIGS. 9 and 10, which show its fabrication processes using top views thereof Conductive sheet metal is, for example by stamping, formed into a lead frame that has a plurality of leads 2 connected to frame portions 10 on both sides and that has element mount portions (island plates) 3 between the frame portions 10 (FIG. 9(a)). At this time, for each would-be device portion, four frame support portions 12 are also formed. Here, each island plate 3 is held in position by being connected to only one lead.

Next, a resin material is molded (resin molding) on the lead frame to form insulating frame members 1 to obtain a plurality of would-be device portions connected together (FIG. 9(b)). Here, the resin is molded so as to include the tips of the frame support portions 12 so that the tips of the frame support portions 12 dip into the side faces of the frame member 1 at four locations.

Thereafter, to electrically insulate the leads connected to the island plates 3 from the other leads, all the leads 2 are cut off from the frame portions 10 (FIG. 9(c)). Here, the frame member 1 is held by being connected to the frame portions 10 by the frame support portions 12, and this makes it possible to handle individual devices together in the form connected to the lead frame even after the process of the mounting of elements. Moreover, the island plate 3 is connected to only one lead, and all the leads are cut off from the frame portions 10. Thus, the twelve leads are all independent. This increases the flexibility of wiring and permits inspection of characteristics through energization in the processes described later.

Figure 10:
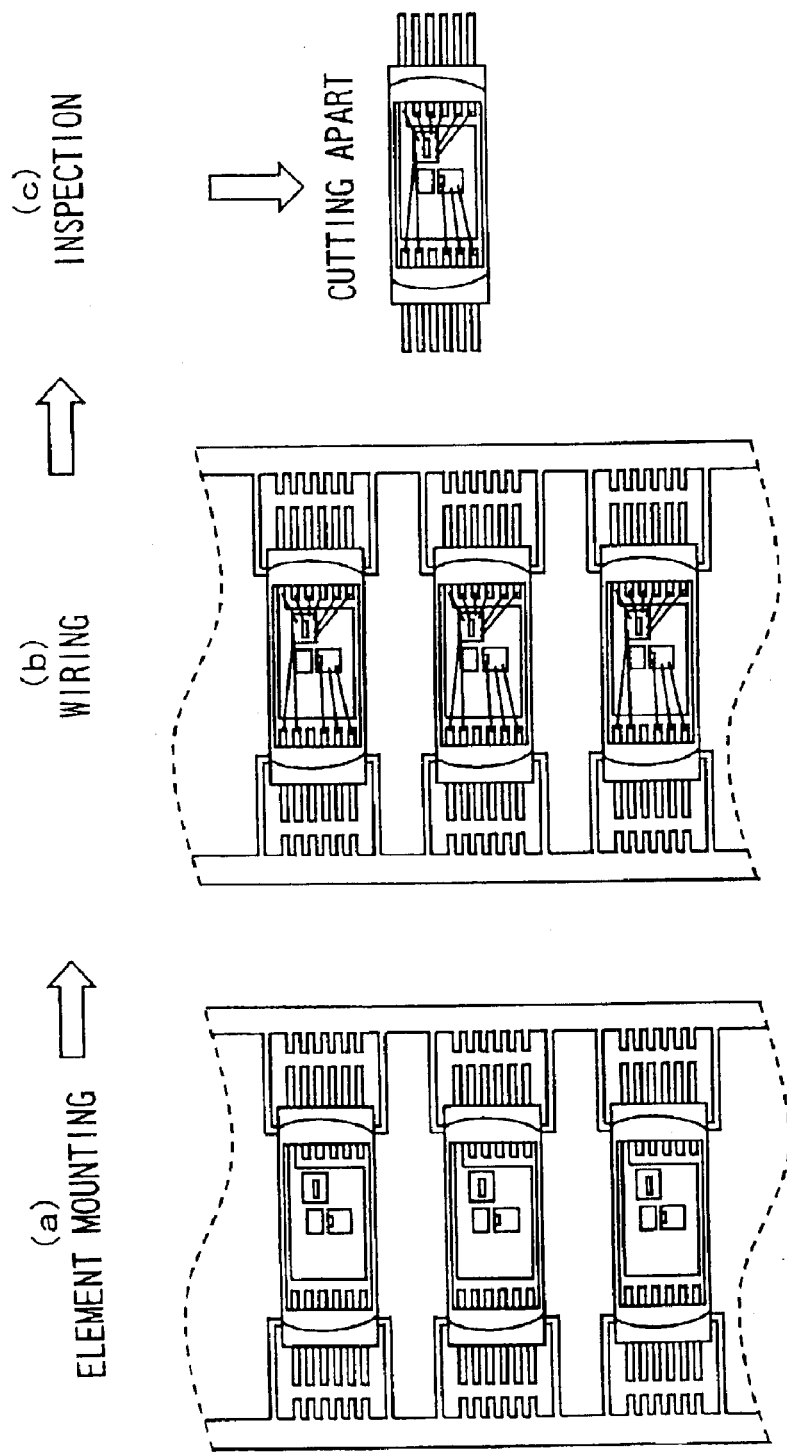
FIG. 10 is a diagram illustrating the processes of fabricating the semiconductor laser device of Embodiment 10 of the invention, using schematic top views thereof.

Thereafter, on each island plate 3, a submount 4 having a semiconductor laser device (LD) mounted thereon, a reflecting member (mirror) 6, and a signal-detecting light-receiving element 7 are mounted (FIG. 10(*a*)). Then, Au wires 8 are laid by wire bonding (FIG. 10(*b*)). Next, as in the conventional example described earlier, screening is performed, light emission characteristics are inspected, a hologram element is fixed, electrical and optical characteristics are inspected, and then, lastly, individual devices are cut off and separated from the frame portions 10. Now, the fabrication of the semiconductor laser device is complete (FIG. 10(*c*)). Here, inspection of optical characteristics is performed by energizing the leads 2.

In the conventional fabrication method described earlier with reference to FIG. 18, after resin molding, first individual devices are cut apart and then mounting of elements, inspection of characteristics, and other processes are performed. This makes handling of the packages difficult. By contrast, according to the fabrication method of this embedment, the frame member 1 is supported by the frame support members 12. This makes it possible to load/unload (set and remove) the lead frame, together with the packages still connected thereto, on and from various kinds of fabrication equipment. Moreover, all the leads 2 are cut off from the frame portions 10. This makes it possible to perform inspection through energization with individual devices still connected to the lead frame. Furthermore, the frame support portions 12 dip into the frame member 1 only at their tips, and therefore they can be pulled out of it easily. This makes it possible to mount elements, perform wire bonding, perform inspection, and perform other operations on individual devices still on the lead frame, and thus enhances mass productivity.

In this way, according to the fabrication method of this embodiment, as described above, inspection is performed with the leads 2 cut off from the frame portions 10 and with the frame member 1 supported by the frame support portions 12 formed in the lead frame. Thus, even with the frame member 1 connected to the lead frame, inspection requiring energization can be performed easily with the individual leads 2 kept at independent potentials. Moreover, it is possible to reduce the number of leads used to support the element mount portion. Furthermore, the resin material is molded so as to include the tip portions of the frame support portions that are not connected to the frame portions 10. Thus, after inspection, simply by pulling out those tip portions, the frame support portions can easily be separated from the frame member 1.

Embodiment 11

Next, as an eleventh embodiment (Embodiment 11) of the invention, a method of fabricating a semiconductor laser device different from those of Embodiment 1 and 10 described earlier and above will be described with reference to FIGS. 11 and 12, which show its fabrication processes using top views thereof, and FIG. 13, which is a schematic perspective view of the frame support portion.

Figure 11:
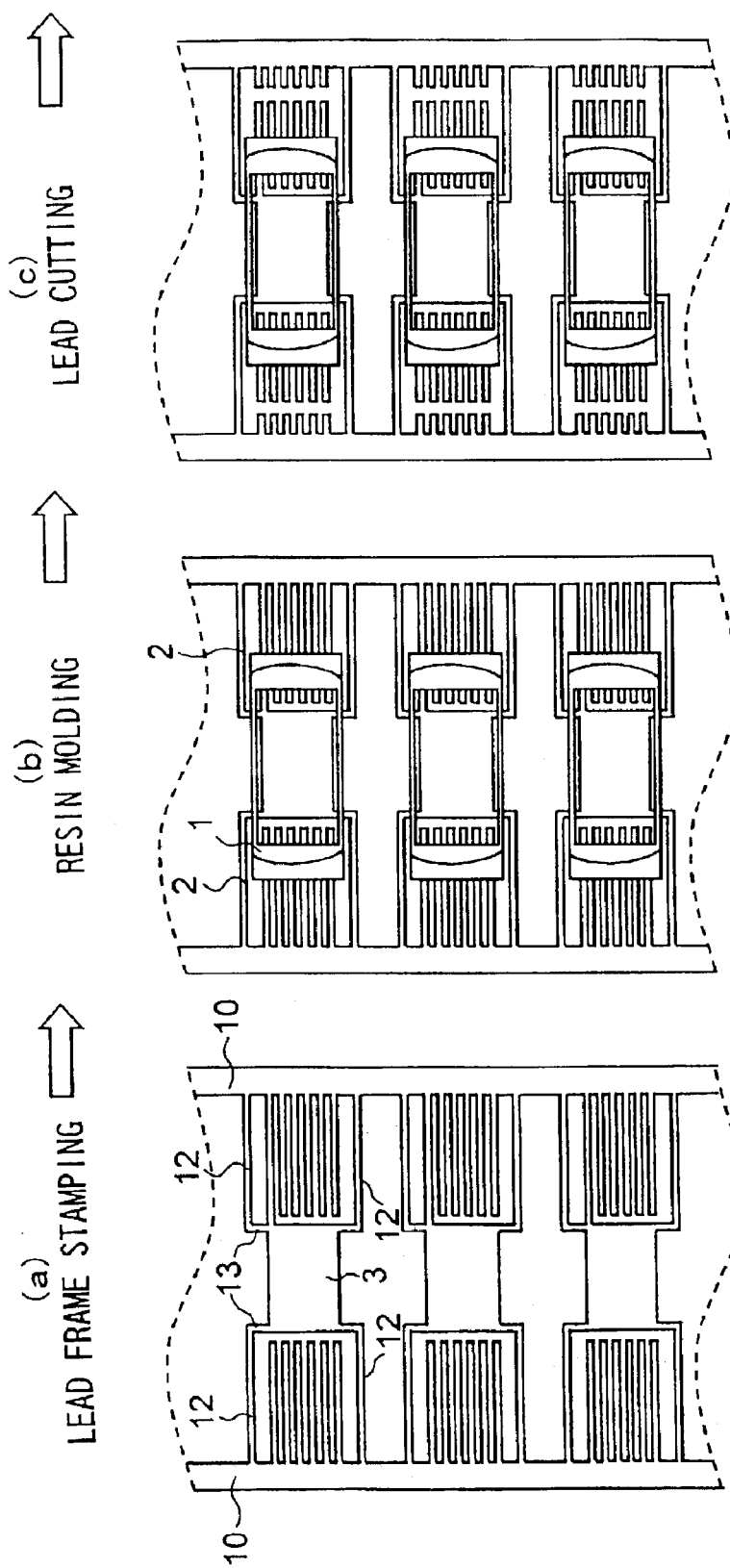
FIG. 11 is a diagram illustrating the processes of fabricating the semiconductor laser device of an eleventh embodiment (Embodiment 11) of the invention, using schematic top views thereof.

Conductive sheet metal is, for example by stamping, formed into a lead frame that has a plurality of leads 2 connected to frame portions 10 on both sides and that has element mount portions (island plates) 3 between the frame portions 10 (FIG. 11(*a*)). At this time, for each would-be device portion, four frame support portions 12 are also formed. Here, each island plate 3 is held in position by being connected to one lead and to the frame support portions 12.

Furthermore, in this embodiment, each frame support portion 12 has a V-shape cut (half notch)13 formed therein near the portion thereof connected to the island plate. As shown in FIG. 13, which is a schematic perspective view of the frame support potion, this half notch 13 is formed in the portion of the frame support portion linearly extending from the portion thereof connected to the island plate 3.

Next, a resin material is molded (resin molding) on the lead frame to form insulating frame members 1 to obtain a plurality of would-be device portions connected together (FIG. 11(*b*)). Here, it is advisable to form the above-mentioned half notches 13 in positions where they will eventually be hidden by the frame member 1. This prevents, after the frame support portions 12 are separated from the frame member 1 in a downstream process, the remaining portions of the frame support portions 12 from sticking out of the frame member 1.

Thereafter, to electrically insulate the leads connected to the island plates 3 from the other leads, all the leads 2 are cut off from the frame portions 10 (FIG. 11(*c*)). Here, the frame member 1 is held by being connected to the frame portions 10 by the frame support portions 12, and this makes it possible to handle individual devices together in the form connected to the lead frame even after the process of the mounting of elements. Moreover, the island plate 3 is supported by the frame support portions 12, and thus the island plate 3 can be supported more stably than in Embodiment 10 described above in a downstream process. Moreover, the island plate 3 is connected to only one lead, and all the leads are cut off from the frame portions 10. Thus, the twelve leads are all independent. This increases the flexibility of wiring and permits inspection of characteristics through energization in the processes described later.

Figure 12:
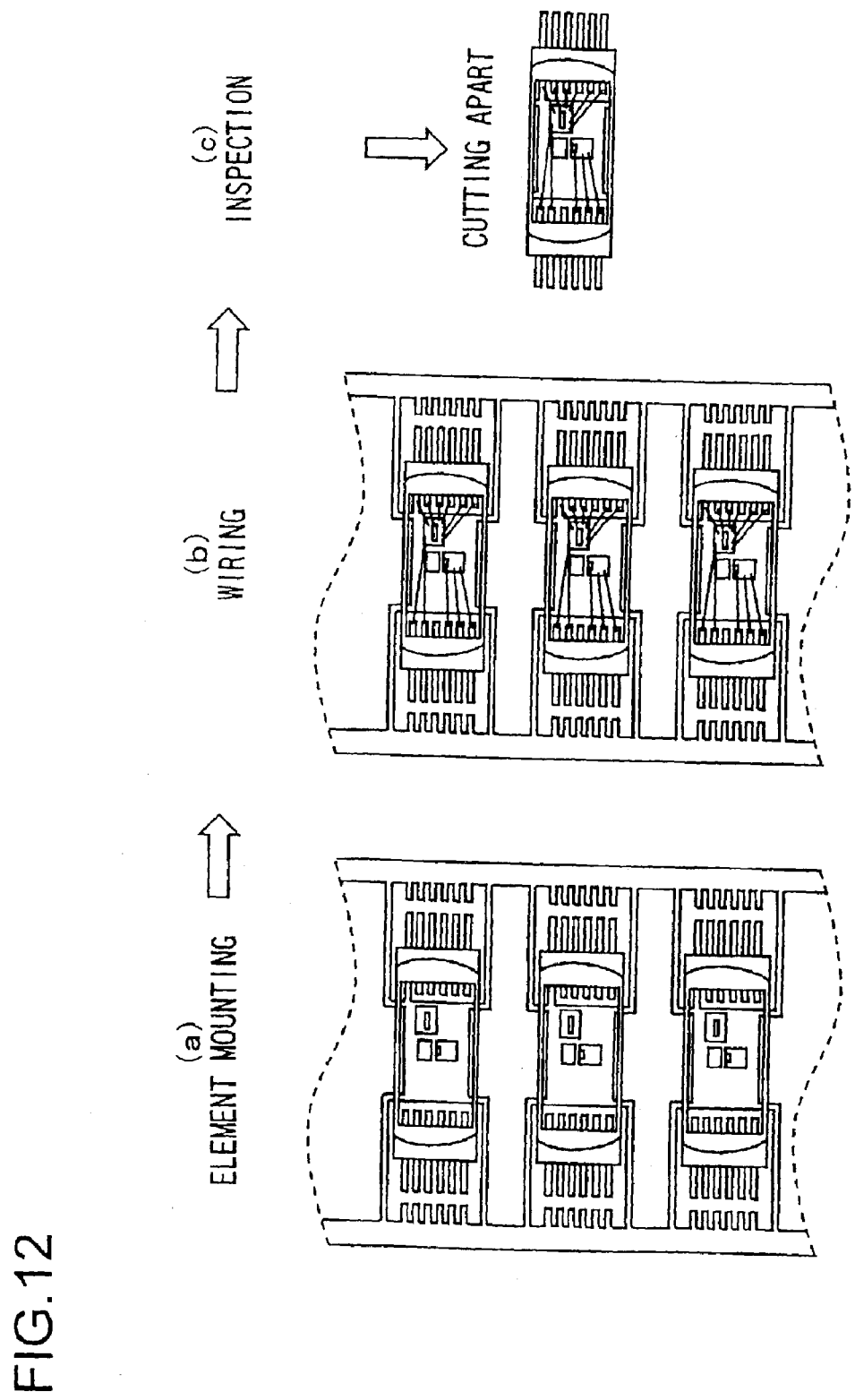
FIG. 12 is a diagram illustrating the processes of fabricating the semiconductor laser device of Embodiment 11 of the invention, using schematic top views thereof.
Figure 13:
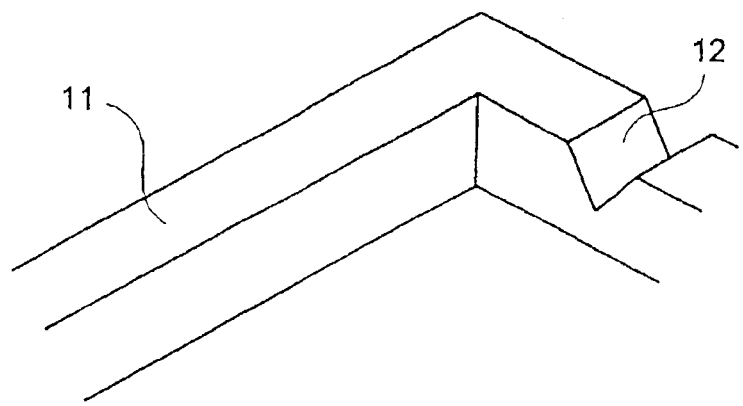
FIG. 13 is a schematic perspective view showing an outline of the structure of a principal portion of the frame support portion of Embodiment 11.

Thereafter, on each island plate 3, a submount 4 having a semiconductor laser device (LD) mounted thereon, a reflecting member (mirror) 6, and a signal-detecting light-receiving element 7 are mounted (FIG. 12(*a*)). Then, Au wires 8 are laid by wire bonding (FIG. 12(*b*)). Next, as in the conventional example described earlier, screening is performed, light emission characteristics are inspected, a hologram element is fixed, electrical and optical characteristics are inspected, and then, lastly, individual devices are cut off and separated from the frame portions 10. Now, the fabrication of the semiconductor laser device is complete (FIG. 12(*c*)). Here, inspection of optical characteristics is performed by energizing the leads 2.

In this embodiment, the half notches 13 are formed. Thus, simply by bending the frame support portions 12, they can be cut at the half notches 13 and thereby easily separated from the frame member.

In the conventional fabrication method described earlier with reference to FIG. 18, after resin molding, first individual devices are cut apart and then mounting of elements, inspection of characteristics, and other processes are performed. This makes handling of the packages difficult. By contrast, according to the fabrication method of this embedment, the frame member 1 is supported by the frame support members 12. This makes it possible to load/unload (set and remove) the lead frame, together with the packages still connected thereto, on and from various kinds of fabrication equipment. Moreover, all the leads are cut off from the frame portions. This makes it possible to perform inspection through energization with individual devices still connected to the lead frame. Furthermore, the frame support portions 12 dip into the frame member 1 only at their tips, and therefore they can be pulled out of it easily. This makes it possible to mount elements, perform wire bonding, perform inspection, and perform other operations on individual devices still on the lead frame, and thus enhances mass productivity.

In this way, according to the fabrication method of this embodiment, as described above, inspection is performed with the leads 2 cut off from the frame portions 10 and with the frame member 1 supported by the frame support portions 12 formed in the lead frame. Thus, even with the frame member 1 connected to the lead frame, inspection requiring energization can be performed easily with the individual leads 2 kept at independent potentials. Moreover, it is possible to reduce the number of leads used to support the element mount portion. Furthermore, half notches are formed in the frame support portions 12 connected to the island plate 3. Thus, after inspection, by bending the frame support portions 12, they can easily be separated from the frame member 1.

Embodiment 12

As a twelfth embodiment (Embodiment 12) of the invention, how heating is achieved when wires are connected (by wire bonding) in a method of fabricating a semiconductor laser device will be described with reference to FIGS. 14A, 14B, 14C, and 15. The following description deals with a case where the heating method of the invention is applied to Embodiment 11 described above. It is to be understood, however, that the heating method can be applied to any of the embodiments described hereinbefore, and even to the conventional example described earlier.

Figure 14B:
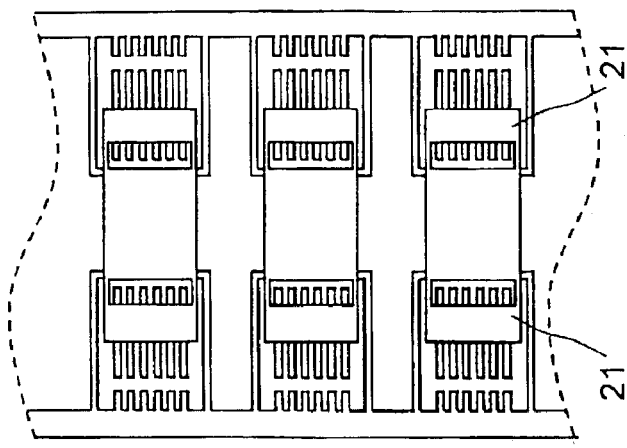
FIGS. 14A to 14C are diagrams illustrating the processes of fabricating the semiconductor laser device of Embodiment 11, FIG. 14A being a schematic top view, FIG. 14B being a schematic bottom view, and FIG. 14C being a schematic side sectional view.
Figure 14C:
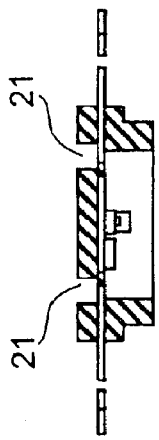
Figure 14A:
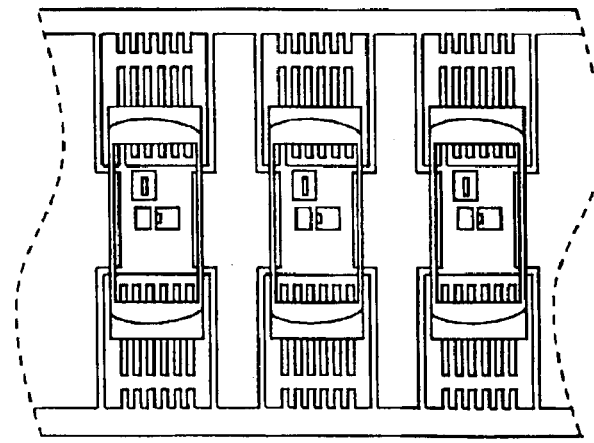
Figure 15:
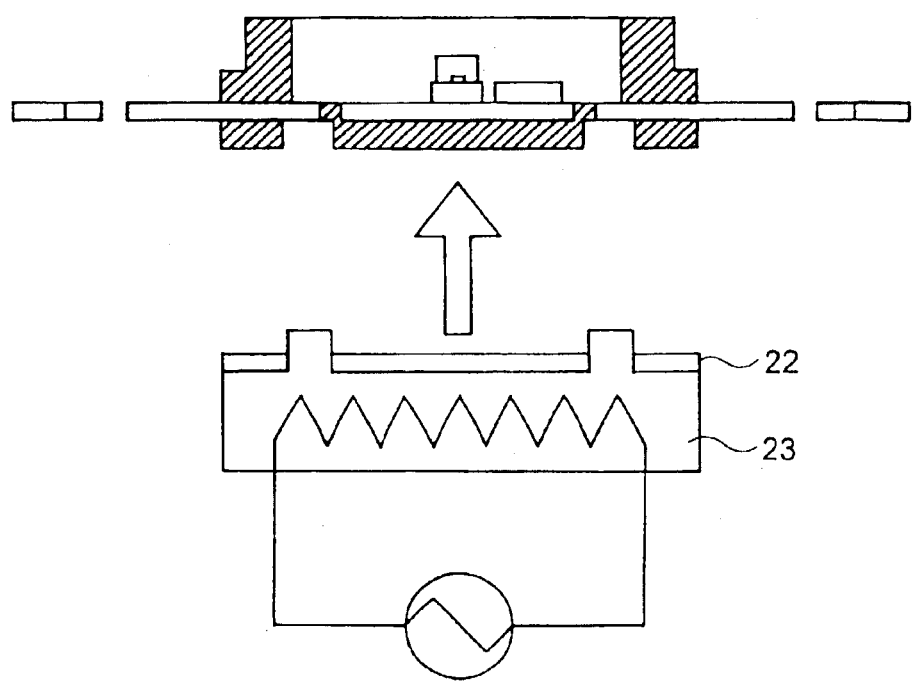
FIG. 15 is a schematic side sectional view illustrating the concept of how heating is achieved in Embodiment 11.
Figure 16:
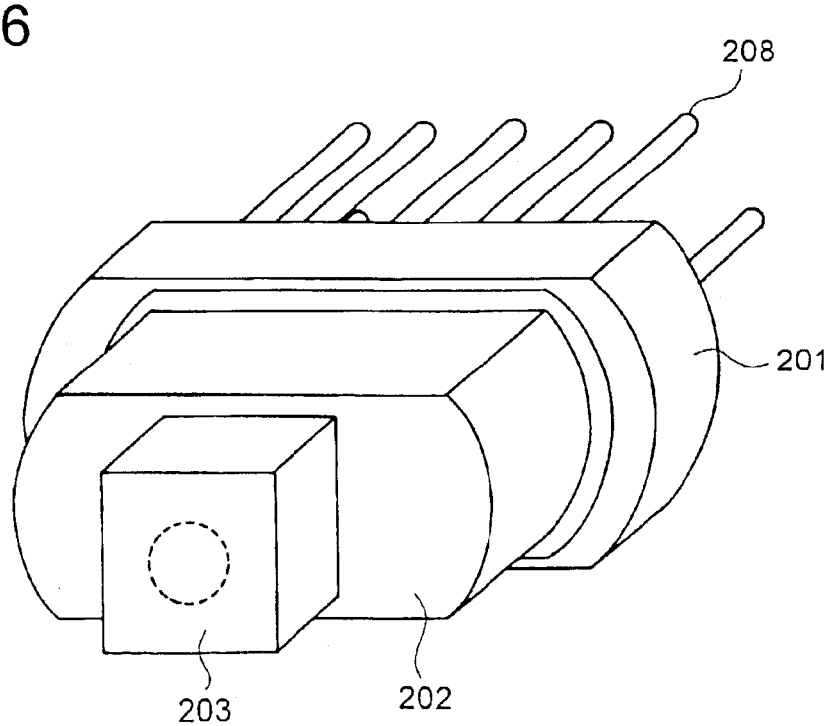
FIG. 16 is a schematic perspective view showing an outline of the structure of a conventional semiconductor laser device.
Figure 17A:
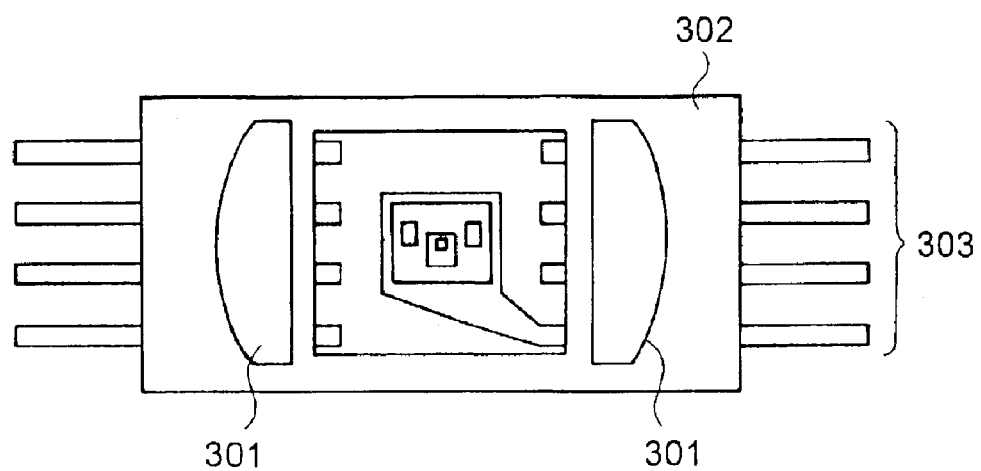
FIGS. 17A and 17B are diagrams showing an outline of the structure of a conventional semiconductor laser device, FIG. 17A being a top view and FIG. 17B being a side sectional view.
Figure 17B:
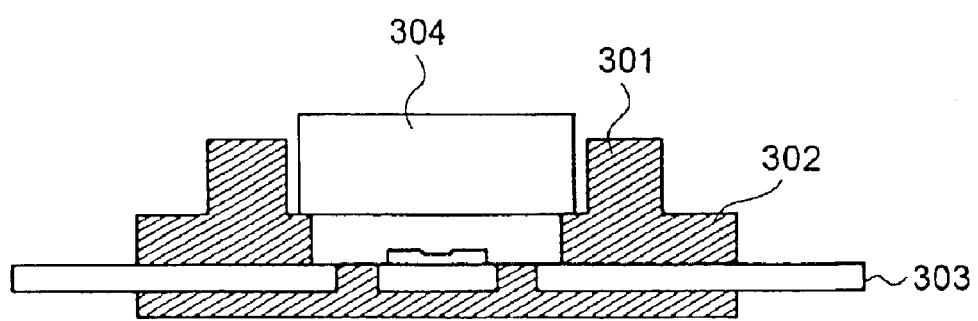

FIG. 14A is a top view corresponding to FIG. 12(a) and showing the state after the mounting of elements, FIG. 14B is a bottom view showing the state shown in FIG. 14A as seen from below, and FIG. 14C is a schematic side sectional view with the element mount side down as seen in the figure. FIG. 15 is a diagram illustrating the concept of how heating is achieved in this embodiment, using a schematic side sectional view.

As shown in FIGS. 14B and 14C, in this embodiment, when the resin material is molded (resin molding) in Embodiment 11 described above, holes 21 are formed in the bottom side of the insulating frame member 1 opposite to the element mount side thereof so as to expose therethrough parts of the leads 2 including the tips thereof located inside the insulating frame member 1.

When wire bonding is performed after the mounting of elements, as shown in FIG. 15, wire bonding is performed, by the use of an electric heater 23 having projections that fit into the holes 21, by heating the leads 2 with those projections kept in contact with the parts thereof exposed through the holes 21. On that side of the heater 23 on which it makes contact with the leads, around the projections, a heat insulating material 22 is laid to prevent the resin of the frame member 1 from being heated.

In other respects than those described above, this embodiment is the same as Embodiment 11 described above.

In this way, in this embodiment, as described above, wires are connected with the heater 23 kept in contact with parts of the leads 2 exposed through the insulating frame member 1 on that side thereof on which no wires are laid. Thus, it is possible to heat the leads 2 without excessively heating the resin of the frame member 1. This makes it easy to connect wires.

In all the embodiments described hereinbefore, since an LD of a side light emission type is used as the LD 5, the mirror 6 is used to turn the optical axis by 90°. Where an LD of a surface light emission type is used, however, there is no need to use the mirror 6. A monitoring light-receiving element for controlling the light output of the LD 5 may be mounted on the island plate 3. Alternatively, the LD 5 may be mounted on the island plate 3 with, instead of the submount 4, a submount incorporating a monitoring light-receiving element (photodiode) for controlling the light output interposed in between.

What is claimed is:

1. A semiconductor laser device including a plurality of leads disposed through each of two side faces of an insulating frame member so as to run from outside to inside the insulating frame member, at least a semiconductor laser element and a light-receiving element mounted inside or on the insulating frame member, and wires laid inside the insulating frame member so as to connect the leads to electrodes of the semiconductor laser element and the light-receiving element, wherein, inside the insulating frame member, a tip of at least one of the leads is extended farther inward than an edge of an element mount portion that faces a tip of at least another of the leads that is disposed through a same side face of the insulating frame member as said at least one of the leads.

2. A semiconductor laser device as claimed in claim 1, wherein said at least one of the leads with the extended tip is located closest to an edge among those of the leads disposed through the same side face of the insulating frame member as said at least one of the leads.

3. A semiconductor laser device as claimed in claim 1, wherein on the insulating frame member is formed a reflecting member mount portion on which is mounted a reflecting member for deflecting light emitted from the semiconductor laser element.

4. A semiconductor laser device as claimed in claim 1, wherein on the insulating frame member is formed a light-receiving element mount portion on which the light-receiving element is mounted parallel to a surface on which the semiconductor laser element is mounted.

5. A semiconductor laser device as claimed in claim 1, wherein one of the leads has a semiconductor laser element mount portion on which the semiconductor laser element is mounted, and a whole or part of the semiconductor laser element mount portion has a thickness greater than a portion of said one of the leads located outside the insulating frame member.

6. A semiconductor laser device as claimed in claim 1, wherein the insulating frame member or a portion thereof formed so as to protrude upward has a shape of a cylinder of which two opposite sides are cut off along two planes parallel to each other and to the cylinder's axis, and the two planes are parallel to a direction of longer sides of the insulating frame member and have different lengths in the direction of the longer sides of the insulating frame member.

7. An optical pickup comprising a semiconductor laser device as claimed in claim 1, wherein a chassis of the optical pickup is disposed in contact with an external surface parallel to a surface on which the semiconductor laser element is mounted.

8. A semiconductor laser device as claimed in claim 4, wherein a light-receiving surface of the light-receiving element mounted on the light-receiving element mount portion is higher than a light-exit surface of the semiconductor laser element.

9. A semiconductor laser device as claimed in claim 6, wherein a hologram element is mounted on a top surface, parallel to the semiconductor laser element mount surface, of the insulating frame member or the portion thereof formed so as to protrude upward, the hologram element diffracting light emitted from the semiconductor laser element disposed inside and reflected back from a medium disposed outside so as to direct the light to the light-receiving element disposed inside.

10. An optical pickup comprising a semiconductor laser device as claimed in claim 6, wherein cylindrical circumferential surfaces of the insulating frame member or the portion thereof formed so as to protrude upward fit in a hole formed in a chassis of the optical pickup.

11. A semiconductor laser device as claimed in claim 9, wherein part of the top surface of the insulating frame member or the portion thereof formed so as to protrude upward is so formed as to jut inward.

12. A semiconductor laser device including a plurality of leads disposed through each of two side faces of an insulating frame member so as to run from outside to inside the insulating frame member, at least a semiconductor laser element and a light-receiving element mounted inside the insulating frame member, and wires laid inside the insulating frame member so as to connect the leads to electrodes of the semiconductor laser element and the light-receiving element, wherein, inside the insulating frame member, at least one of the leads is bent toward an edge of that side face of the insulating frame member through which said at least one of the leads is disposed.

13. A semiconductor laser device as claimed in claim 12, wherein, inside the insulating frame member, said at least one of the leads that is bent is extended farther inward than the lead located next thereto in a direction in which said at least one of the leads is bent.

14. A semiconductor laser device including at least a semiconductor laser element and a light-receiving element mounted inside an insulating frame member, electrodes of the semiconductor laser element and the light-receiving element being electrically connected to leads inside the insulating frame member, wherein, inside the insulating frame member, a relay electrode is provided that is connected by way of a wire to at least one of the electrodes of the semiconductor laser element and the light-receiving element and that is connected by way of a wire to at least one of the leads.

* * * * *